US012765188B2

(12) United States Patent
Choi et al.

(10) Patent No.: US 12,765,188 B2
(45) **Date of Patent: *Oct. 13, 2026**

(54) DISPLAY APPARATUS WITH INSULATING PIXEL SEPARATION LAYERS BURIED IN TRENCHES OF DIFFERENT INSULATING LAYERS

(71) Applicant: Samsung Display Co., Ltd., Yongin-si (KR)

(72) Inventors: Jonghyun Choi, Yongin-si (KR); Younjoon Kim, Yongin-si (KR); Minjeong Oh, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 365 days.

This patent is subject to a terminal disclaimer.

(21) Appl. No.: 18/505,557

(22) Filed: Nov. 9, 2023

(65) Prior Publication Data

US 2024/0306439 A1 Sep. 12, 2024

(30) Foreign Application Priority Data

Mar. 7, 2023 (KR) ........................ 10-2023-0030210

(51) Int. Cl.
*H10K 59/124* (2023.01)
*H10K 59/122* (2023.01)

(52) U.S. Cl.
CPC ......... *H10K 59/124* (2023.02); *H10K 59/122* (2023.02)

(58) Field of Classification Search
CPC ........................... H10K 59/124; H10K 59/122
See application file for complete search history.

(56) References Cited

U.S. PATENT DOCUMENTS

| | | | |
|---|---|---|---|
| 10,551,680 B2 | 2/2020 | Park et al. | |
| 10,868,096 B2 | 12/2020 | Park et al. | |
| 11,342,519 B2 | 5/2022 | Bu | |
| 11,482,580 B2 | 10/2022 | Song et al. | |
| 12,610,698 B2 * | 4/2026 | Choi | H10K 59/124 |

(Continued)

FOREIGN PATENT DOCUMENTS

| | | | |
|---|---|---|---|
| CN | 109671761 B | 6/2020 | |
| CN | 110690226 B | 6/2021 | |

(Continued)

*Primary Examiner* — Lex H Malsawma

(74) *Attorney, Agent, or Firm* — CANTOR COLBURN LLP

(57) ABSTRACT

A display apparatus that is flexible and robust includes a substrate defining a first area and a second area, the first area including a plurality of first pixel and a plurality of first separation areas between first pixel areas adjacent to each other in the first direction, the second area including a plurality of second pixel areas, a first insulating layer having a plurality of first trenches and a plurality of second trenches, the plurality of first trenches respectively corresponding to boundaries between first pixel areas arranged in the first direction and the plurality of first separation areas, the plurality of second trenches corresponding to boundaries between second pixel areas arranged in the first direction, a plurality of first separation layers buried in the plurality of first trenches, and a plurality of second separation layers buried in the plurality of second trenches.

20 Claims, 24 Drawing Sheets

(56) References Cited

U.S. PATENT DOCUMENTS

| | | | | |
|---|---|---|---|---|
| 2012/0307423 | A1* | 12/2012 | Bohn | H04M 1/0216 361/679.01 |
| 2014/0346474 | A1* | 11/2014 | Jeong | H10K 77/10 257/40 |
| 2018/0145125 | A1* | 5/2018 | Lee | H10K 77/111 |
| 2019/0036068 | A1 | 1/2019 | Kim et al. | |
| 2019/0041915 | A1* | 2/2019 | Park | G02F 1/133305 |
| 2019/0148476 | A1* | 5/2019 | Park | H10K 59/8731 257/40 |
| 2019/0156708 | A1 | 5/2019 | Li et al. | |
| 2020/0176720 | A1* | 6/2020 | Bu | H10K 77/111 |
| 2021/0066422 | A1 | 3/2021 | Gong | |
| 2021/0126021 | A1 | 4/2021 | Zhao | |
| 2021/0202633 | A1 | 7/2021 | Song et al. | |
| 2022/0093705 | A1* | 3/2022 | Kim | H10D 86/451 |
| 2022/0376011 | A1 | 11/2022 | Choi | |
| 2023/0008830 | A1 | 1/2023 | Jang | |
| 2023/0064938 | A1 | 3/2023 | Kim et al. | |
| 2023/0371318 | A1* | 11/2023 | Choi | H10K 59/124 |

FOREIGN PATENT DOCUMENTS

| | | | |
|---|---|---|---|
| CN | 113053949 | A | 6/2021 |
| CN | 218123411 | U | 12/2022 |
| KR | 20170039537 | A | 4/2017 |
| KR | 1020170132943 | A | 12/2017 |
| KR | 20190104091 | A | 9/2019 |
| KR | 20210084733 | A | 7/2021 |
| KR | 20230010109 | A | 1/2023 |

* cited by examiner

DISPLAY APPARATUS WITH INSULATING PIXEL SEPARATION LAYERS BURIED IN TRENCHES OF DIFFERENT INSULATING LAYERS

This application claims priority to Korean Patent Application No. 10-2023-0030210, filed on Mar. 7, 2023, and all the benefits accruing therefrom under 35 U.S.C. § 119, the content of which in its entirety is herein incorporated by reference.

BACKGROUND

1. Field

One or more embodiments relate to a display apparatus.

2. Description of the Related Art

Recently, the usage of display apparatuses has diversified. Also, as display apparatuses have become thinner and more lightweight, the use thereof has additionally expanded.

As display apparatuses are used in various ways, various methods may be used to design the shapes of the display apparatuses. In addition, while increasing the area occupied by a display area in the display apparatuses, various functions have been connected or linked to the display apparatuses.

SUMMARY

One or more embodiments include a high-resolution display apparatus that is flexible and robust against external impact.

The technical problems to be solved by the disclosure are not limited to the technical problems described above, and other technical problems that are not mentioned herein will be clearly understood by those of ordinary skill in the art from the following description.

Additional aspects will be set forth in part in the description which follows and, in part, will be apparent from the description, or may be learned by practice of the presented embodiments.

According to one or more embodiments, a display apparatus includes a substrate defining a first area and a second area, the first area including a plurality of first pixel areas arranged in a first direction and a second direction and a plurality of first separation areas respectively between first pixel areas adjacent to each other in the first direction among the plurality of first pixel areas, and the second area including a plurality of second pixel areas arranged in the first direction and the second direction, a first insulating layer disposed on the substrate and having a plurality of first trenches and a plurality of second trenches, the plurality of first trenches being arranged in the first direction and respectively corresponding to boundaries between first pixel areas arranged in the first direction among the plurality of first pixel areas and the plurality of first separation areas, the plurality of second trenches being arranged in the first direction and respectively corresponding to boundaries between second pixel areas arranged in the first direction among the plurality of second pixel areas, a plurality of first separation layers respectively buried in the plurality of first trenches and including a material that is different from a material of the first insulating layer, and a plurality of second separation layers respectively buried in the plurality of second trenches and including a material that is different from the material of the first insulating layer.

In an embodiment, a first length of each of the plurality of first pixel areas in the first direction may be substantially equal to a second length of each of the plurality of second pixel areas in the first direction, and a third length of each of the plurality of first separation areas in the first direction may be less than the first length.

In an embodiment, a first interval between some first separation layers adjacent to each other in the first direction among the plurality of first separation layers may be substantially equal to a second interval between second separation layers adjacent to each other in the first direction among the plurality of second separation layers, and a third interval between other first separation layers adjacent to each other in the first direction among the plurality of first separation layers may be less than the first interval.

In an embodiment, first pixel areas arranged in the first direction among the plurality of first pixel areas and the plurality of first separation areas may be alternately arranged in the first direction, and second pixel areas may be arranged in the first direction among the plurality of second pixel areas to be adjacent to each other, and second pixel areas may be arranged in the second direction among the plurality of second pixel areas and may be spaced apart from each other.

In an embodiment, the first area may further include a plurality of second separation areas respectively between first pixel areas adjacent to each other in the second direction among the plurality of first pixel areas, the second area may further include a plurality of third separation areas respectively between second pixel areas adjacent to each other in the second direction among the plurality of second pixel areas, the first insulating layer may further have a plurality of third trenches and a plurality of fourth trenches, the plurality of third trenches being arranged in the second direction and respectively corresponding to boundaries between first pixel areas arranged in the second direction among the plurality of first pixel areas and the plurality of second separation areas, and the plurality of fourth trenches being arranged in the second direction and respectively corresponding to boundaries between second pixel areas arranged in the second direction among the plurality of second pixel areas and the plurality of third separation areas, and the display apparatus may further include a plurality of third separation layers respectively buried in the plurality of third trenches and including a material that is different from a material of the first insulating layer, and a plurality of fourth separation layers respectively buried in the plurality of fourth trenches and including a material that is different from the material of the first insulating layer.

In an embodiment, a first length of each of the plurality of first pixel areas in the first direction may be substantially equal to a second length of each of the plurality of second pixel areas in the first direction, a third length of each of the plurality of first separation areas in the first direction may be less than the first length, a fourth length of each of the plurality of first pixel areas in the second direction may be substantially equal to a fifth length of each of the plurality of second pixel areas in the second direction, a sixth length of each of the plurality of second separation areas in the second direction may be less than the fourth length, and a seventh length of each of the plurality of third separation areas in the second direction may be substantially equal to the sixth length.

In an embodiment, a first interval between first separation layers disposed adjacent to each other in the first direction among the plurality of first separation layers may be substantially equal to a second interval between second separation layers disposed to be adjacent to each other in the first direction among the plurality of second separation layers, a third interval between other first separation layers adjacent to each other in the first direction among the plurality of first separation layers may be less than the first interval, a fourth interval between some third separation layers adjacent to each other in the second direction among the plurality of third separation layers may be substantially equal to a fifth interval between some fourth separation layers adjacent to each other in the second direction among the plurality of fourth separation layers, a sixth interval between other third separation layers adjacent to each other in the second direction among the plurality of third separation layers may be less than the fourth interval, and a seventh interval between other fourth separation layers adjacent to each other in the second direction among the plurality of fourth separation layers may be substantially equal to the sixth interval.

In an embodiment, a first thickness of each of the plurality of first separation layers in a thickness direction of the substrate may be greater than a second thickness of each of the plurality of second separation layers in the thickness direction of the substrate.

In an embodiment, a plurality of first areas and a plurality of second areas may be provided, and the plurality of first areas and the plurality of second areas may be alternately arranged in the first direction.

In an embodiment, the display apparatus may further include a plurality of first pixel circuits respectively disposed on some second pixel areas among the plurality of second pixel areas, a plurality of second pixel circuits respectively disposed on other second pixel areas among the plurality of second pixel areas, a plurality of first display elements disposed on the first area and electrically connected to the plurality of first pixel circuits, respectively, and a plurality of second display elements disposed on the second area and electrically connected to the plurality of second pixel circuits, respectively, wherein a first interval between first display elements adjacent to each other in the first direction among the plurality of first display elements may be substantially equal to a second interval between second display elements adjacent to each other in the first direction among the plurality of second display elements.

In an embodiment, the display apparatus may further include a plurality of conductive patterns respectively disposed to be between the substrate and the plurality of first separation layers and to be in contact with the plurality of first separation layers.

In an embodiment, the display apparatus may further include a plurality of semiconductor patterns respectively disposed between the substrate and the plurality of first separation layers and to be in contact with the plurality of first separation layers.

In an embodiment, a first thickness of each of the plurality of first separation layers in a thickness direction of the substrate may be substantially equal to a second thickness of each of the plurality of second separation layers in the thickness direction of the substrate.

In an embodiment, the display apparatus may further include a plurality of first pixel circuits respectively disposed on the plurality of first pixel areas, a plurality of second pixel circuits respectively disposed on the plurality of second pixel areas, a plurality of first display elements disposed on the first area and electrically connected to the plurality of first pixel circuits, respectively, and a plurality of second display elements disposed on the second area and electrically connected to the plurality of second pixel circuits, respectively, wherein a first interval between first display elements adjacent to each other in the first direction among the plurality of first display elements may be substantially equal to a second interval between second display elements adjacent to each other in the first direction among the plurality of second display elements.

In an embodiment, the substrate may further define a folding area including the first area and the second area, and a non-folding area, and the display apparatus may further include a support layer disposed below the substrate, the support layer including a first support portion comprising a slit corresponding to the first area of the folding area and a rib corresponding to the second area of the folding area, and a second support portion corresponding to the non-folding area.

In an embodiment, the non-folding area may include a plurality of third pixel areas arranged in the first direction and the second direction and a plurality of second separation areas respectively disposed between third pixel areas to be adjacent to each other in the first direction among the plurality of third pixel areas, the first insulating layer may further have a plurality of third trenches arranged in the first direction and respectively corresponding to boundaries between third pixel areas arranged in the first direction among the plurality of third pixel areas and the plurality of second separation areas, and the display apparatus may further include a plurality of third separation layers respectively buried in the plurality of third trenches and including a material that is different from a material of the first insulating layer.

In an embodiment, a first thickness of each of the plurality of first separation layers in a thickness direction of the substrate may be greater than a second thickness of each of the plurality of second separation layers in the thickness direction of the substrate and a third thickness of each of the plurality of third separation layers in the thickness direction of the substrate.

In an embodiment, the display apparatus may further include a plurality of first pixel circuits respectively disposed on some second pixel areas among the plurality of second pixel areas, a plurality of second pixel circuits respectively disposed on other second pixel areas among the plurality of second pixel areas, a plurality of third pixel circuits respectively disposed on the plurality of third pixel areas, a plurality of first display elements disposed on the first area of the folding area and electrically connected to the plurality of first pixel circuits, respectively, a plurality of second display elements disposed on the second area of the folding area and electrically connected to the plurality of second pixel circuits, respectively, and a plurality of third display elements disposed on the non-folding area and electrically connected to the plurality of third pixel circuits, respectively, wherein a first interval between first display elements adjacent to each other in the first direction among the plurality of first display elements may be substantially equal to a second interval between second display elements adjacent to each other in the first direction among the plurality of second display elements and a third interval between third display elements adjacent to each other in the first direction among the plurality of third display elements.

In an embodiment, the first insulating layer may include an inorganic material, and the plurality of first separation layers and the plurality of second separation layers may each include an organic material.

In an embodiment, the display apparatus may further include a conductive layer disposed on the first insulating layer, and a second insulating layer disposed on the conductive layer and configured to be integral with the plurality of first separation layers and the plurality of second separation layers.

Other aspects, features, and advantages of the disclosure will become better understood through the detailed description, the claims, and/or the accompanying drawings.

These general and specific aspects may be practiced by using systems, methods, computer programs, and/or any combination thereof.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
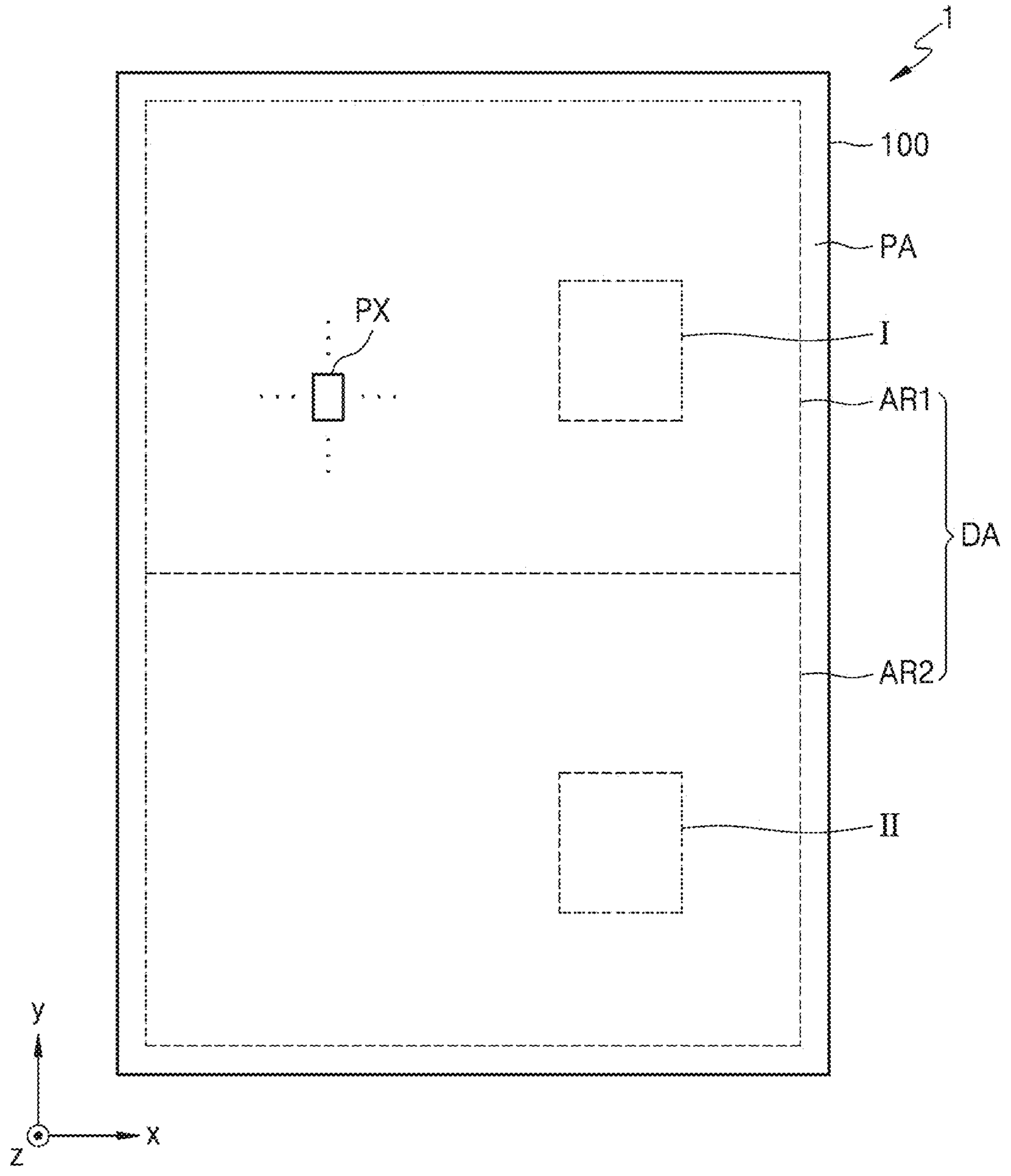
FIG. 1 is a plan view schematically illustrating a display apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present description allows for various changes and numerous embodiments, certain embodiments will be illustrated in the drawings and described in detail in the written description. Effects and features of the disclosure, and methods of achieving them will be clarified with reference to embodiments described below in detail with reference to the drawings. However, the disclosure is not limited to the following embodiments and may be embodied in various forms.

Throughout the following embodiments, the singular form is intended to include the plural form as well, unless the context clearly indicates otherwise.

It will be further understood that the terms "include" and/or "comprise" used herein specify the presence of stated features or elements, but do not preclude the presence or addition of one or more other features or elements.

It will be further understood that, when a layer, region, or element is referred to as being "on" another layer, region, or element, it may be directly or indirectly on the other layer, region, or element. That is, for example, intervening layers, regions, or elements may be present.

Also, sizes of elements in the drawings may be exaggerated or reduced for convenience of explanation. For example, because sizes and thicknesses of elements in the drawings are arbitrarily illustrated for convenience of explanation, the disclosure is not limited thereto.

When a certain embodiment may be implemented differently, a specific process order may be performed differently from the described order. For example, two consecutively described processes may be performed substantially at the same time or performed in an order opposite to the described order.

In this specification, the expression "A and/or B" indicates only A, only B, or both A and B. In this specification, the expression "at least one of A and B" indicates only A, only B, or both A and B.

It will be further understood that when layers, regions, or elements are referred to as being connected to each other, they may be directly connected to each other or indirectly connected to each other with intervening layers, regions, or elements therebetween. For example, when layers, regions, or elements are referred to as being electrically connected to each other, they may be directly electrically connected to each other or indirectly electrically connected to each other with intervening layers, regions, or elements therebetween.

The x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

FIG. 1 is a plan view schematically illustrating a display apparatus 1 according to an embodiment.

In an embodiment and referring of FIG. 1, the display apparatus 1 may include a display area DA in which an image is displayed, and a peripheral area PA surrounding at least a portion of the display area DA. The display apparatus 1 may provide an image to the outside by using light emitted from the display area DA. Because the display apparatus 1 includes a substrate 100, it may be stated that the substrate 100 has the display area DA and the peripheral area PA. In other words, it may be stated that the display area DA and the peripheral area PA are defined in the substrate 100.

The substrate 100 may include various materials, such as glass, metal, and/or plastic. According to an embodiment, the substrate 100 may include a flexible material. The flexible material refers to a bendable, foldable, and/or rollable material. The substrate 100 including the flexible material may include ultra-thin glass, metal, and/or plastic.

In an embodiment, the display area DA may have a rectangular shape, as illustrated in FIG. 1. In another embodiment, the display area DA may have a polygonal shape, such as a triangular, pentagonal, or hexagonal shape, a circular shape, an elliptical shape, or an irregular shape.

In an embodiment, pixels PX including various display elements, such as organic light-emitting diodes (OLEDs), may be arranged in the display area DA of the substrate 100. A plurality of pixels PX may be provided. The pixels PX may be arranged in various forms, such as a stripe arrangement, a pentile arrangement, and/or a mosaic arrangement, and may implement an image. Hereinafter, the pixels PX may refer to sub-pixels that emit different colors from each other. The pixels PX may each be, for example, one of a red sub-pixel, a green sub-pixel, and a blue sub-pixel.

An organic light-emitting display will be described as an example of the display apparatus according to an embodiment, but the display apparatus according to the disclosure is not limited thereto. In another embodiment, examples of the display apparatus according to the disclosure may include an inorganic light-emitting display (or an inorganic electroluminescence (EL) display), a quantum dot light-emitting display, and the like. For example, an emission layer of a display element included in the display apparatus 1 may include an organic material, an inorganic material, and/or quantum dots, and may include an organic material and quantum dots, and may include an inorganic material and quantum dots, and/or may include an organic material, an inorganic material, and quantum dots.

The display area DA may include a first area AR1 and a second area AR2. As will be described below with reference to FIG. 2, the first area AR1 may include first pixel areas PXAR1 arranged at a first pitch in the first direction (e.g., ±y directions), and the second area AR2 may include second pixel areas PXAR2 arranged at a second pitch different from the first pitch in the first direction (e.g., ±y directions).

In an embodiment, FIG. 1 illustrates that the area of the first area AR1 is equal to the area of the second area AR2, but in another embodiment, the area of the first area AR1 may be different from the area of the second area AR2. Also, in an embodiment, a plurality of first area AR1 may be provided and a plurality of second area AR2 may be provided. The first areas AR1 and the second areas AR2 may be alternately arranged in one direction.

In an embodiment, the peripheral area PA of the substrate 100 is an area around the display area DA and may be an area in which an image is not displayed. Various wirings configured to transmit electrical signals to be applied to the display area DA and pads to which a printed circuit board and/or a driver integrated circuit (IC) chip is attached may be located in the peripheral area PA.

Figure 2:
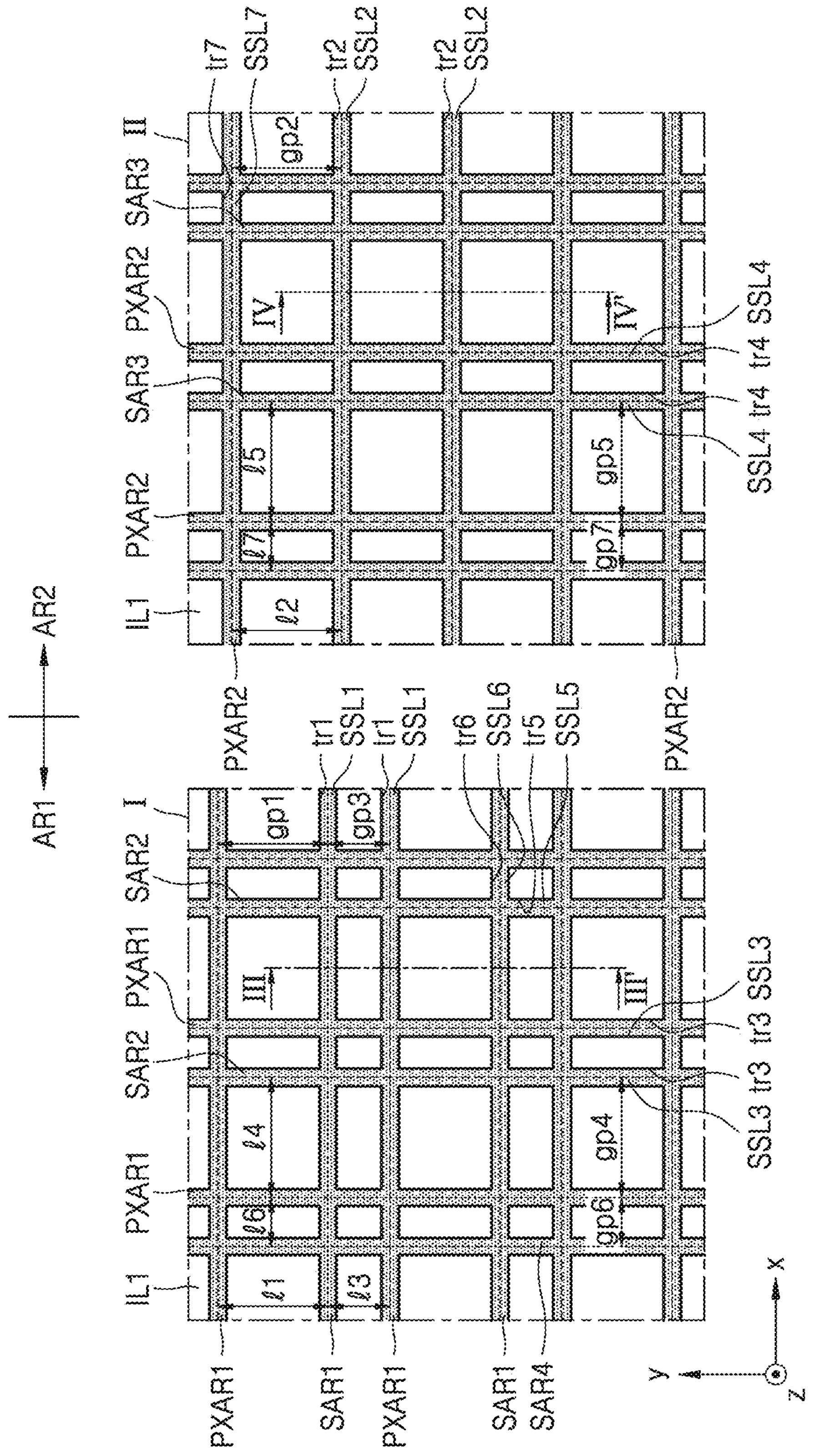
FIG. 2 is an enlarged plan view illustrating an example of regions I and II of FIG. 1 according to an embodiment.

FIG. 2 is an enlarged plan view illustrating an example of regions I and II of FIG. 1 according to an embodiment.

In an embodiment and referring to FIG. 2, the display apparatus (see 1 of FIG. 1) may include the substrate (see 100 of FIG. 1) including the first area AR1 and the second area AR2 (or defining the first area AR1 and the second area AR2), a first insulating layer IL1, and first to seventh separating layers SSL1, SSL2, SSL3, SSL4, SSL5, SSL6, and SSL7, respectively.

In an embodiment, the first area AR1 may include first pixel areas PXAR1, first separation areas SAR1, second separation areas SAR2, and fourth separation areas SAR4.

In an embodiment, the first pixel areas PXAR1 may be arranged in the first direction (e.g., ±y directions) and the second direction (e.g., x directions). The first pixel areas PXAR1 may be spaced apart from each other. The first separation areas SAR1 may be disposed between the first pixel areas PXAR1 adjacent to each other in the first direction (e.g., ±y directions). The first pixel areas PXAR1 and the first separation areas SAR1 may be alternately arranged in the first direction (e.g., ±y direction). The second separation areas SAR2 may be disposed between the first pixel areas PXAR1 adjacent to each other in the second direction (e.g., ±x directions). The first pixel areas PXAR1 and the second separation areas SAR2 may be alternately arranged in the second direction (e.g., x directions). The fourth separation areas SAR4 may be surrounded by the first separation areas SAR1 and the second separation areas SAR2. The fourth separation areas SAR4 and the first separation areas SAR1 may be alternately arranged in the second direction (e.g., ±x directions), and the fourth separation areas SAR4 and the second separation areas SAR2 may be alternately arranged in the first direction (e.g., ±y directions).

The second area AR2 may include second pixel areas PXAR2 and third separation areas SAR3 according to an embodiment.

In an embodiment, the second pixel areas PXAR2 may be arranged in the first direction (e.g., ±y directions) and the second direction (e.g., x directions). The second pixel areas PXAR2 arranged in the first direction (e.g., ±y directions) may be adjacent to each other, and the second pixel areas PXAR2 arranged in the second direction (e.g., ±x directions) may be spaced apart from each other. The second separation areas SAR3 may be disposed between the second pixel areas PXAR2 adjacent to each other in the second direction (e.g., x directions). The second pixel areas PXAR2 and the third separation areas SAR3 may be alternately arranged in the second direction (e.g., ±x directions).

In an embodiment, a first length l1 of each of the first pixel areas PXAR1 in the first direction (e.g., ±y directions) may be substantially equal to a second length l2 of each of the second pixel areas PXAR2 in the first direction (e.g., ±y directions). A third length l3 of each of the first separation areas SAR1 in the first direction (e.g., ±y directions) may be less than the first length l1.

In an embodiment, a fourth length l4 of each of the first pixel areas PXAR1 in the second direction (e.g., ±x directions) may be substantially equal to a fifth length l5 of each of the second pixel areas PXAR2 in the second direction (e.g., ±x directions). A sixth length l6 of each of the second separation areas SAR2 in the second direction (e.g., ±x directions) may be less than the fourth length l4. A seventh length l7 of each of the third separation areas SAR3 in the second direction (e.g., ±x directions) may be substantially equal to the sixth length l6.

In an embodiment, the first insulating layer IL1 may be disposed on the substrate 100. The first insulating layer IL1 may include first to seventh trenches tr1, tr2, tr3, tr4, tr5, tr6, and tr7, respectively. Additionally, a number of differently shaped and differently sized interval gaps delimited by the plurality of first pixel areas arranged in the first and second directions in the first area exceeds a number of differently shaped and differently sized interval gaps delimited by the plurality of the second pixel areas arranged in the first and second directions in the second area.

In an embodiment, the first trenches tr1 may respectively correspond to boundaries between the first pixel areas PXAR1 and the first separation areas SAR1 arranged in the first direction (e.g., ±y directions) and may be arranged in the first direction (e.g., ±y directions). The second trenches tr2 may respectively correspond to boundaries between the second pixel areas PXAR2 arranged in the first direction (e.g., ±y directions) and may be arranged in the first direction (e.g., ±y directions). The third trenches tr3 may respectively correspond to boundaries between the first pixel areas PXAR1 and the second separation areas SAR2 arranged in the second direction (e.g., x directions) and may be arranged in the second direction (e.g., ±x directions). The fourth trenches tr4 may respectively correspond to boundaries between the second pixel areas PXAR2 and the third separation areas SAR3 arranged in the second direction (e.g., x directions) and may be arranged in the second direction (e.g., ±x directions). The fifth trenches tr5 may respectively correspond to boundaries between the first separation areas SAR1 and the fourth separation areas SAR4 and may be arranged in the second direction (e.g., ±x directions). The sixth trenches tr6 may respectively correspond to boundaries between the second separation areas SAR2 and the fourth separation areas SAR4 and may be arranged in the first direction (e.g., ±y directions). The seventh trenches tr7 may respectively correspond to boundaries between the third separation areas SAR3 arranged in the first direction (e.g., ±y directions) and may be arranged in the first direction (e.g., ±y directions).

In an embodiment, the first trench tr1, the third trench tr3, the fifth trench tr5, and the sixth trench tr6 may be integral with each other. The second trench tr2, the fourth trench tr4, and the seventh trench tr7 may be integral with each other.

In an embodiment, the first separation layers SSL1 may be respectively buried in the first trenches tr1. The second separation layers SSL2 may be respectively buried in the second trenches tr2. The third separation layers SSL3 may be respectively buried in the third trenches tr3. The fourth separation layers SSL4 may be respectively buried in the fourth trenches tr4. The fifth separation layers SSL5 may be respectively buried in the fifth trenches tr5. The sixth separation layers SSL6 may be respectively buried in the sixth trenches tr6. The seventh separation layers SSL7 may be respectively buried in the seventh trenches tr7.

In an embodiment, the first separation layers SSL1, the third separation layers SSL3, the fifth separation layers SSL5, and the sixth separation layers SSL6 may have a grid shape (or a mesh structure). The second separation layers SSL2, the fourth separation layers SSL4, the seventh separation layers SSL7 may have a grid shape (or a mesh structure).

In an embodiment, the first separation layers SSL1, the third separation layers SSL3, the fifth separation layers SSL5, and the sixth separation layers SSL6 may be integral with each other. The second separation layers SSL2, the fourth separation layers SSL4, and the seventh separation layers SSL7 may be integral with each other.

On the other hand, in an embodiment, FIG. 2 illustrates that the first pixel area PXAR1 is completely surrounded by the first separation layers SSL1 and the third separation layers SSL3, but in another embodiment, the first pixel area PXAR1 may be partially surrounded by the first separation layers SSL1 and the third separation layers SSL3. Although the first pixel area PXAR1 has been mainly described, the same descriptions may also be applied to the second pixel area PXAR2 and the first to fourth separation areas SAR1, SAR2, SAR3, and SAR4. For example, FIG. 2 illustrates that the second pixel area PXAR2 is completely surrounded by the second separation layers SSL2 and the fourth separation layers SSL4, but in another embodiment, the second pixel area PXAR2 may be partially surrounded by the second separation layers SSL2 and the fourth separation layers SSL4.

In an embodiment, a first interval gp1 between some first separation layers SSL1 adjacent to each other in the first direction (e.g., ±y directions) may be substantially equal to a second interval gp2 between the second separation layers SSL2 which are adjacent to each other in the first direction (e.g., ±y directions). A third interval gp3 between other first separation layers SSL1 which are adjacent to each other in the first direction (e.g., ±y directions) may be less than the first interval gp1.

In an embodiment, a fourth interval gp4 between some third separation layers SSL3 which are adjacent to each other in the second direction (e.g., x directions) may be substantially equal to a fifth interval gp5 between some fourth separation layers SSL4 which are adjacent to each other in the second direction (e.g., ±x directions). A sixth interval gp6 between other third separation layers SSL3 which are adjacent to each other in the second direction (e.g., ±x directions) may be less than the fourth interval gp4. A seventh interval gp7 between other fourth separation layers SSL4 which are adjacent to each other in the second direction (e.g., ±x directions) may be substantially equal to the sixth interval gp6.

In an embodiment, the first to seventh separation layers SSL1, SSL2, SSL3, SSL4, SSL5, SSL6, and SSL7, respectively, may include a material that is different from a material of the first insulating layer IL1. For example, the first insulating layer IL1 may include an inorganic material, and the first to seventh separation layers SSL1, SSL2, SSL3, SSL4, SSL5, SSL6, and SSL7, respectively, may include an organic material. Because the first to seventh separation layers SSL1, SSL2, SSL3, SSL4, SSL5, SSL6, and SSL7, respectively, include an organic material, growth of cracks formed in the first insulating layer IL1 including an inorganic material in a pixel into an adjacent pixel due to external impact may be more effectively prevented or minimized.

Figure 3:
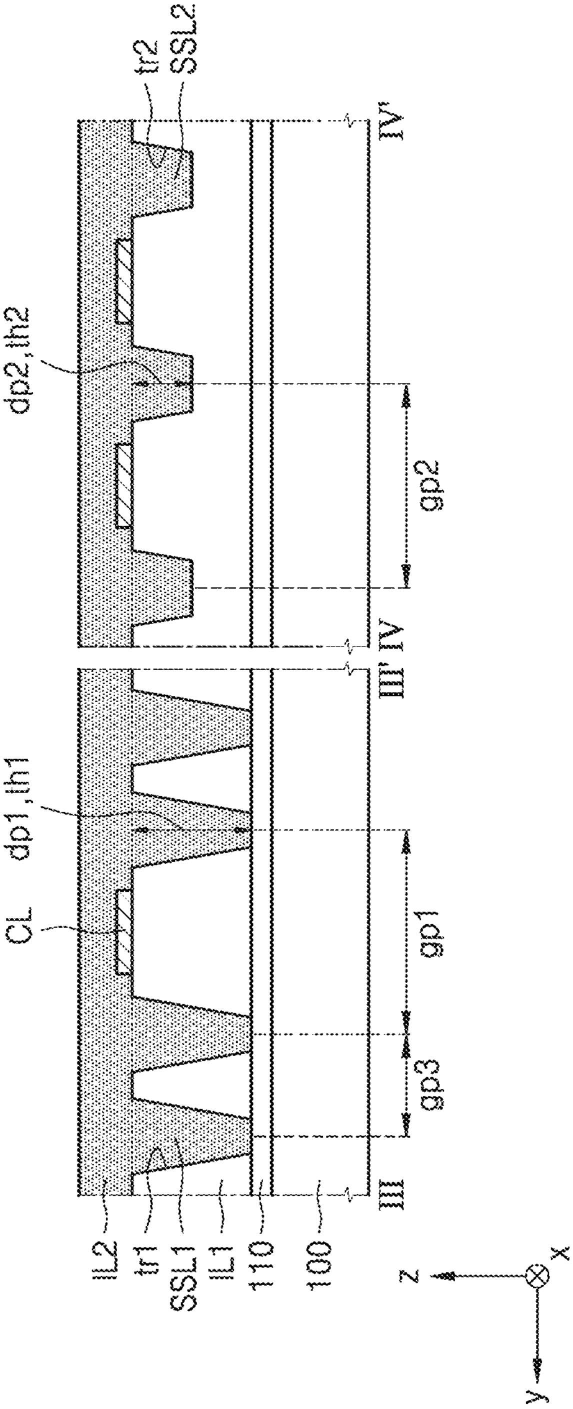
FIG. 3 is a cross-sectional view illustrating an example of a portion of the display apparatus of FIG. 2 taken along lines III-III' and IV-IV' according to an embodiment.

FIG. 3 is a cross-sectional view illustrating an example of a portion of the display apparatus 1 of FIG. 2 taken along lines III-III' and IV-IV' according to an embodiment.

In an embodiment and referring to FIG. 3, the display apparatus (see 1 of FIG. 1) may include a substrate 100, a barrier layer 110, a first insulating layer IL1, a second insulating layer IL2, first and second separation layers SSL1 and SSL2, and a conductive layer CL.

In an embodiment, the substrate 100 may include glass and/or polymer resin. The polymer resin may include polyethersulfone, polyacrylate, polyetherimide, polyethylene naphthalate, polyethylene terephthalate, polyphenylene sulfide, polyarylate, polyimide, polycarbonate, and/or cellulose acetate propionate. The substrate 100 including the polymer resin may be flexible, rollable, and/or bendable. The substrate 100 may have a multilayer structure including an inorganic layer and a layer including the polymer resin described above.

In an embodiment, the barrier layer 110 may be disposed on the substrate 100. The barrier layer 110 may prevent or minimize infiltration of impurities from the substrate 100 or the like into the display apparatus 1. The barrier layer 110 may include an inorganic material, such as an oxide and/or a nitride, an organic material, and/or an organic/inorganic composite material, and may have a single-layer and/or multilayer structure including an inorganic material and/or an organic material.

In an embodiment, the first insulating layer IL1 may be disposed on the barrier layer 110. The first insulating layer IL1 may include silicon oxide ($SiO_X$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_X$). The first insulating layer IL1 may have first trenches tr1 and second trenches tr2. As described above with reference to FIG. 2, the first trenches tr1 may respectively correspond to boundaries between the first pixel areas PXAR1 and the first separation areas SAR1 arranged in the first direction (e.g., ±y directions), and the second trenches tr2 may respectively correspond to boundaries between the second pixel areas PXAR2 arranged in the first direction (e.g., ±y directions).

In an embodiment, a first depth dp1 of the first trench tr1 in the thickness direction (e.g., z directions) of the substrate 100 may be different from a second depth dp2 of the second trench tr2 in the thickness direction (e.g., ±z directions) of the substrate 100. For example, the first depth dp1 may be greater than the second depth dp2. Although the first trench tr1 and the second trench tr2 have been mainly described, the same description may also be applied to the third to seventh trenches tr3, tr4, tr5, tr6, and tr7, respectively, illustrated in FIG. 2. A depth of each of the third trench tr3, the fifth trench tr5, and the sixth trench tr6 in the thickness direction (e.g., ±z directions) of the substrate 100 may be greater than a depth of each of the fourth trench tr4 and the seventh trench tr7 in the thickness direction (e.g., z directions) of the substrate 100.

In an embodiment, the first separation layer SSL1 may be in the first trench tr1, and the second separation layer SSL2 may be in the second trench tr2. In other words, the first separation layer SSL1 may be buried in the first trench tr1, and the second separation layer SSL2 may be buried in the second trench tr2. Because the first and second separation layers SSL1 and SSL2 are respectively in the first and second trenches tr1 and tr2, a height difference (e.g., step) in the first insulating layer IL1 due to the first and second trenches tr1 and tr2 may be removed or minimized. The first and second separation layers SSL1 and SSL2 may include a single layer or layers including an organic material. For example, the first and second separation layers SSL1 and SSL2 may each include general-purpose polymer (e.g., benzocyclobutene (BCB), polyimide, hexamethyldisiloxane (HMDSO), polymethylmethacrylate (PMMA), and/or polystyrene (PS)), polymer derivatives having a phenolic group, acrylic polymer, imide-based polymer, aryl ether-based polymer, amide-based polymer, fluorine-based polymer, p-xylene-based polymer, vinyl alcohol-based polymer, and/or any blend thereof.

In an embodiment, a first interval gp1 between some first separation layers SSL1 adjacent to each other in the first direction (e.g., ±y directions) may be substantially equal to a second interval gp2 between the second separation layers SSL2 adjacent to each other in the first direction (e.g., ±y directions). A third interval gp3 between some first separation layers SSL1 disposed adjacent to each other in the first direction (e.g., ±y directions) may be different from the first interval gp1. For example, the third interval gp3 may be less than the first interval gp1.

In an embodiment, a first thickness th1 of the first separation layer SSL1 in the thickness direction (e.g., ±z directions) of the substrate 100 may be different from a second thickness th2 of the second separation layer SSL2 in the thickness direction (e.g., ±z directions) of the substrate 100. For example, the first thickness th1 may be greater than the second thickness th2. Although the first separation layer SSL1 and the second separation layer SSL2 have been mainly described, the same description may also be applied to the third to seventh separation layers SSL3, SSL4, SSL5, SSL6, and SSL7, respectively, illustrated in FIG. 2. A thickness of each of the third separation layer SSL3, the fifth separation layer SSL5, and the sixth separation layer SSL6 in the thickness direction (e.g., z directions) of the substrate 100 may be greater than a thickness of each of the fourth separation layer SSL4 and the seventh separation layer SSL7 in the thickness direction (e.g., z directions) of the substrate 100.

In an embodiment, the conductive layer CL may be disposed on the first insulating layer IL1. The conductive layer CL may include a conductive material including molybdenum (Mo), aluminum (Al), copper (Cu), titanium (Ti), and/or the like, and may include a single layer and/or layers including the conductive material described above. For example, the conductive layer CL may have a multilayer structure of Ti/Al/Ti.

In an embodiment, the second insulating layer IL2 may be disposed on the first insulating layer IL1 so as to cover the first conductive layer CL. The second insulating layer IL2 may include a single layer or layers including an organic material and may provide a flat upper surface. The second insulating layer IL2 may include general-purpose polymer (e.g., BCB, polyimide, HMDSO, PMMA, or PS), polymer derivatives having a phenolic group, acrylic polymer, imide-based polymer, aryl ether-based polymer, amide-based polymer, fluorine-based polymer, p-xylene-based polymer, vinyl alcohol-based polymer, and/or any blend thereof.

In an embodiment, the second insulating layer IL2 and the first and second separation layers SSL1 and SSL2 may be integral with each other.

Figure 4:
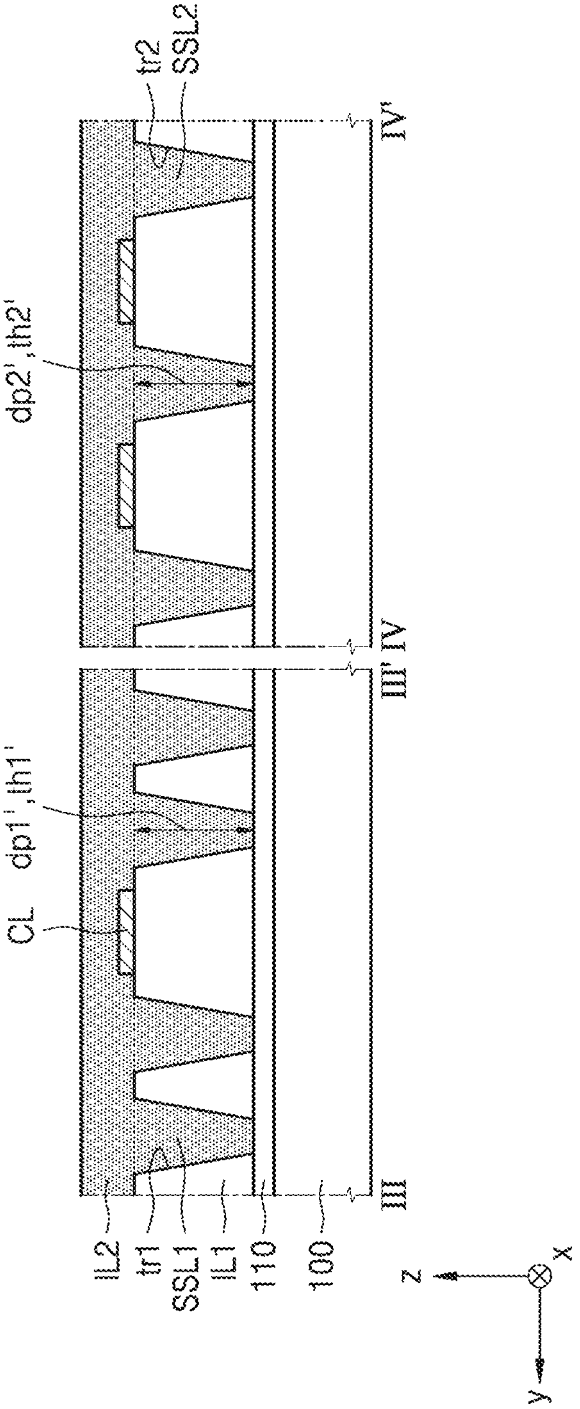
FIG. 4 is a cross-sectional view illustrating an example of a portion of the display apparatus of FIG. 2 taken along lines III-III' and IV-IV' according to an embodiment.

FIG. 4 is a cross-sectional view illustrating an example of a portion of the display apparatus 1 of FIG. 2 taken along lines III-III' and IV-IV' according to an embodiment. FIG. 4 is a modification of FIG. 3 and differs from FIG. 3 in view of structures of trenches and separation layers. Hereinafter, the same description as provided above with reference to FIG. 3 is equally applied to the description of FIG. 4 and the differences from FIG. 3 are mainly described.

Referring to FIG. 4, in an embodiment, a first depth dp1' of a first trench tr1 in the thickness direction (e.g., z directions) of a substrate 100 may be substantially equal to a second depth dp2' of a second trench tr2 in the thickness direction (e.g., ±z directions) of the substrate 100. Although the first trench tr1 and the second trench tr2 have been mainly described, the same description may also be applied to the third to seventh trenches tr3, tr4, tr5, tr6, and tr7, respectively, illustrated in FIG. 2. A depth of each of the third trench tr3, the fifth trench tr5, and the sixth trench tr6 in the thickness direction (e.g., ±z directions) of the substrate 100 may be substantially equal to a depth of each of the fourth trench tr4 and the seventh trench tr7 in the thickness direction (e.g., ±z directions) of the substrate 100.

In an embodiment, a first thickness th1' of a first separation layer SSL1 in the thickness direction (e.g., z directions) of the substrate 100 may be substantially equal to a second thickness th2' of a second separation layer SSL2 in the thickness direction (e.g., ±z directions) of the substrate 100. Although the first separation layer SSL1 and the second separation layer SSL2 have been mainly described, the same description may also be applied to the third to seventh separation layers SSL3, SSL4, SSL5, SSL6, and SSL7, respectively, illustrated in FIG. 2. A thickness of each of the third separation layer SSL3, the fifth separation layer SSL5, and the sixth separation layer SSL6 in the thickness direction (e.g., z directions) of the substrate 100 may be substantially equal to a thickness of each of the fourth separation layer SSL4 and the seventh separation layer SSL7 in the thickness direction (e.g., ±z directions) of the substrate 100.

Figure 5:
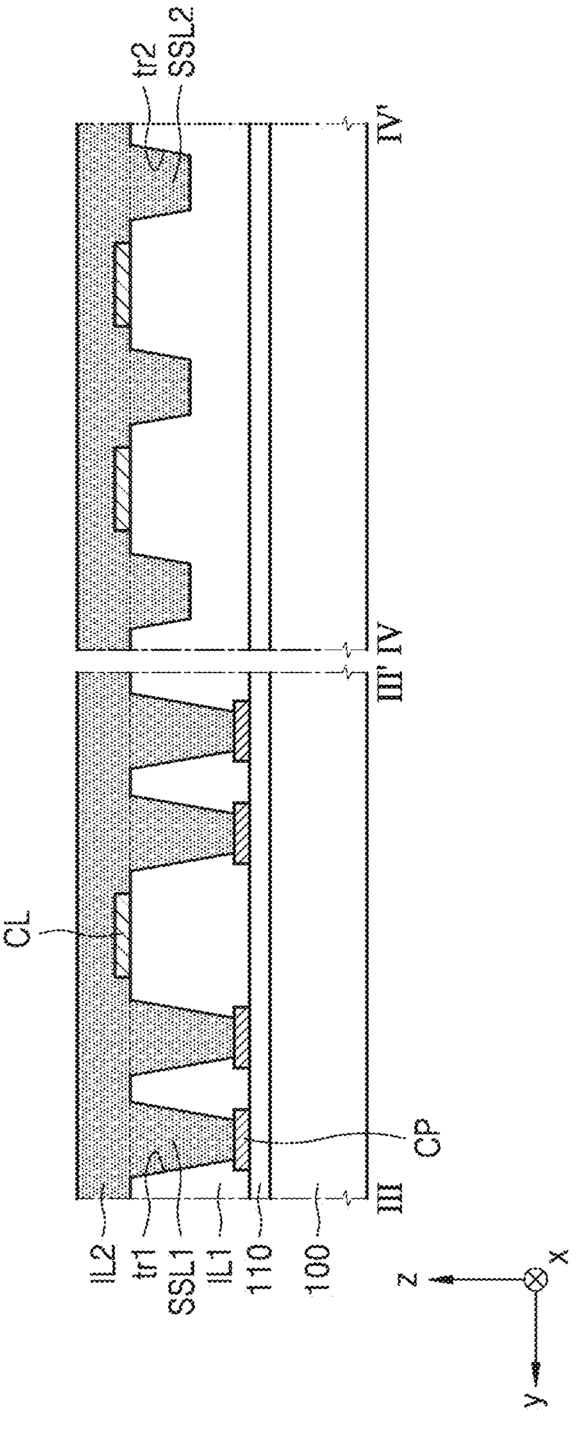
FIG. 5 is a cross-sectional view illustrating an example of a portion of the display apparatus of FIG. 2 taken along lines III-III' and IV-IV' according to an embodiment.

FIG. 5 is a cross-sectional view illustrating an example of a portion of the display apparatus 1 of FIG. 2 taken along lines III-III' and IV-IV' according to an embodiment. FIG. 5 is a modification of FIG. 3 and differs from FIG. 3 in view of a structure of a conductive pattern. Hereinafter, the same description as provided above with reference to FIG. 3 is equally applied to the description of FIG. 5 and the differences from FIG. 3 are mainly described.

In an embodiment and referring to FIG. 5, the display apparatus (see 1 of FIG. 1) may include conductive patterns CP. The conductive patterns CP may be disposed between a substrate 100 and the first separation layers SSL1 and may be in contact with the first separation layers SSL1, respectively. The conductive patterns CP may each include a conductive material including molybdenum (Mo), aluminum (Al), copper (Cu), titanium (Ti), and the like, and may include a single layer and/or layers including the conductive material described above. For example, the conductive patterns CP may each be a single Mo layer.

In an embodiment, when a first insulating layer IL1 is etched in order to form first trenches tr1, the conductive patterns CP may assist in making the etched depth uniform. Due to the conductive patterns CP between the substrate 100 and the first separation layers SSL1, the first trenches tr1 having the uniform depth may be formed in the first insulating layer IL1.

Figure 6:
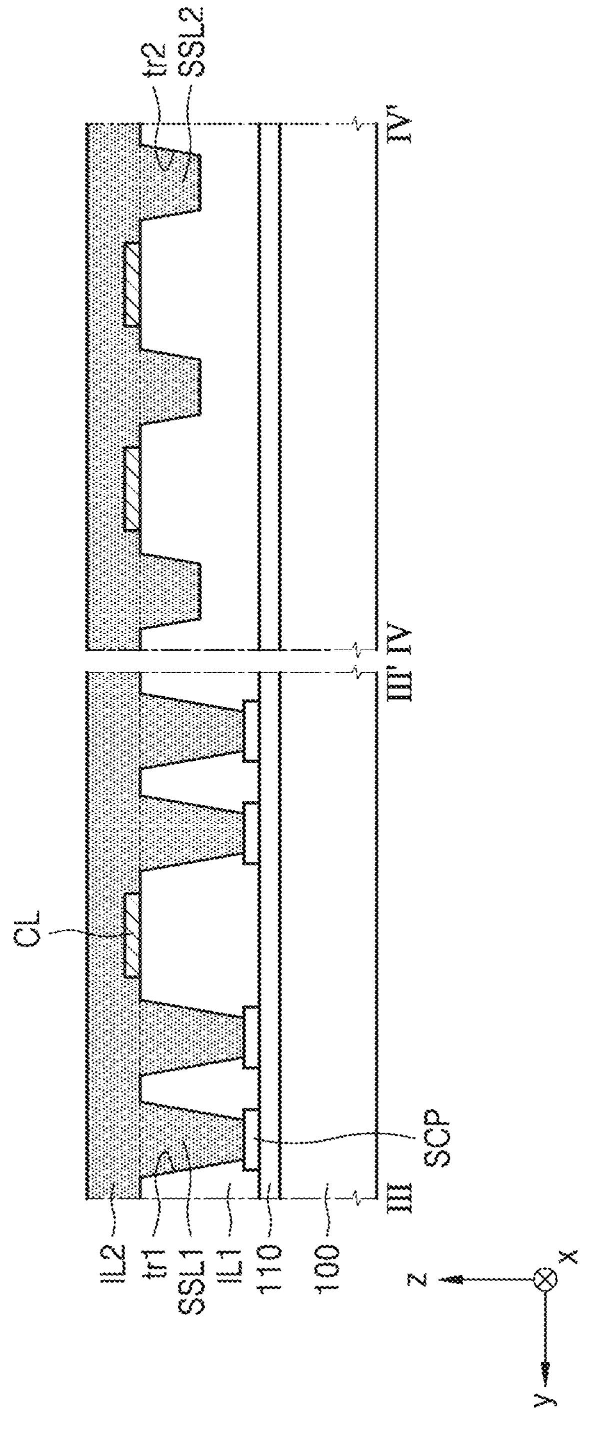
FIG. 6 is a cross-sectional view illustrating an example of a portion of the display apparatus of FIG. 2 taken along lines III-III' and IV-IV' according to an embodiment.

FIG. 6 is a cross-sectional view illustrating an example of a portion of the display apparatus 1 of FIG. 2 taken along lines III-III' and IV-IV' according to an embodiment. FIG. 6 is a modification of FIG. 3 and differs from FIG. 3 in view of a structure of a semiconductor pattern. Hereinafter, the same description as provided above with reference to FIG. 3 is equally applied to the description of FIG. 6 and the differences from FIG. 3 are mainly described.

In an embodiment and referring to FIG. 6, the display apparatus (see 1 of FIG. 1) may include semiconductor patterns SCP. The semiconductor patterns SCP may be disposed between a substrate 100 and the first separation layers SSL1 and may be in contact with the first separation layers SSL1, respectively. The semiconductor patterns SCP may each include amorphous silicon and/or polysilicon. In another embodiment, the semiconductor patterns SCP may each include an oxide of at least one selected from indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

In an embodiment, when a first insulating layer IL1 is etched in order to form first trenches tr1, the semiconductor patterns SCP may assist in making the etched depth uniform. Due to the semiconductor patterns SCP being disposed between the substrate 100 and the first separation layers SSL1, the first trenches tr1 having the uniform depth may be formed in the first insulating layer IL1.

Figure 7:
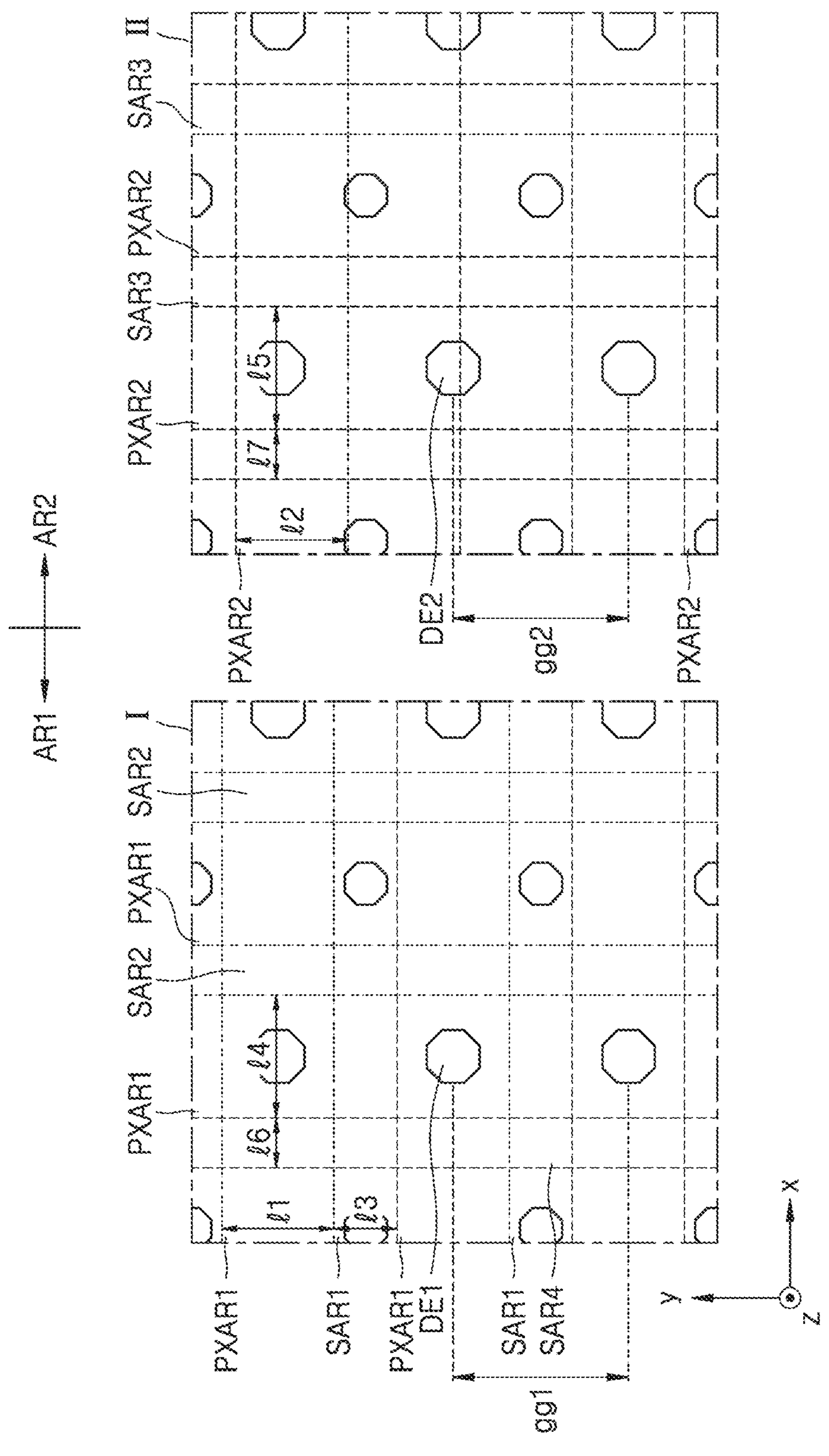
FIG. 7 is an enlarged plan view illustrating an example of regions I and II of FIG. 1 according to an embodiment.

FIG. 7 is an enlarged plan view illustrating an example of regions I and II of FIG. 1 according to an embodiment. In FIG. 7, the same reference numerals as those in FIG. 2 denote the same members, and redundant descriptions thereof are omitted.

In an embodiment and referring to FIG. 7, the display apparatus (see 1 of FIG. 1) may include first display elements DE1 and second display elements DE2. The first display elements DE1 may be arranged in a first area AR1 in the first direction (e.g., ±y directions) and the second direction (e.g., x directions). The second display elements DE2 may be arranged in a second area AR2 in the first direction (e.g., ±y directions) and the second direction (e.g., ±x directions).

In an embodiment, a first interval gg1 is between the first display elements DE1 to be adjacent to each other in the first direction (e.g., ±y directions) among the first display elements DE1 and may be substantially equal to a second interval gg2 between the second display elements DE2 to be adjacent to each other in the first direction (e.g., ±y directions) among the second display elements DE2. Although the number (or arrangement, shape, etc.) of pixel areas and separation areas included in the first area AR1 and the number (or arrangement, shape, etc.) of pixel areas and separation areas included in the second area AR2 are different, the first interval gg1 may be substantially equal to the second interval gg2.

Figure 8:
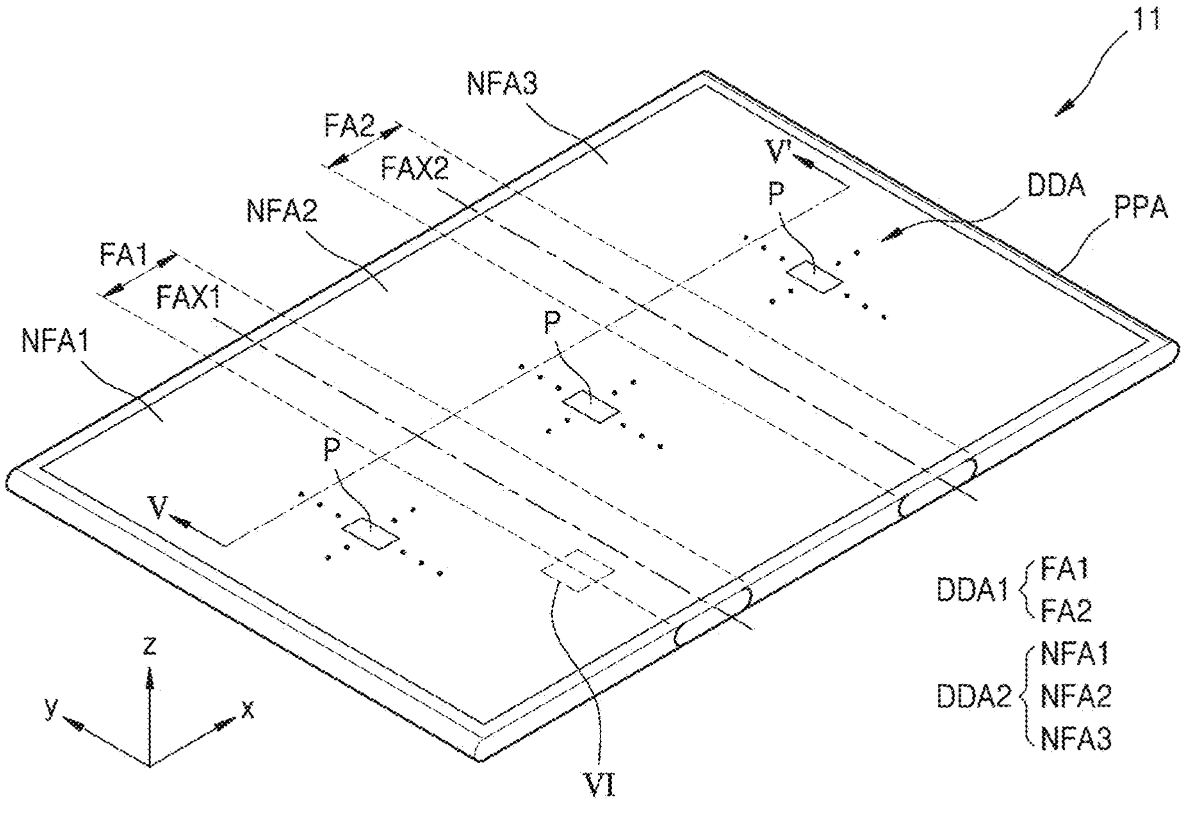
FIG. 8 is a perspective view schematically illustrating a display apparatus when unfolded, according to an embodiment.
Figure 9:
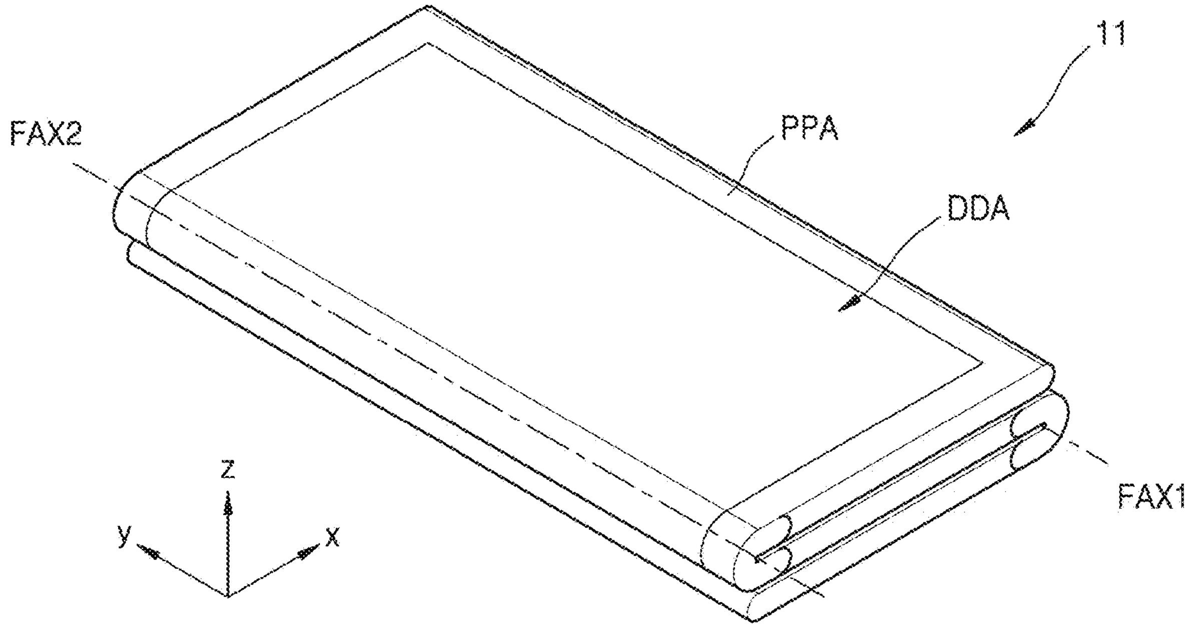
FIG. 9 is a perspective view schematically illustrating a display apparatus when folded, according to an embodiment.

FIG. 8 is a perspective view schematically illustrating a display apparatus 11 according to an embodiment. FIG. 9 is a perspective view schematically illustrating the display apparatus 11 when folded, according to an embodiment. FIG. 8 is a perspective view illustrating a state in which the display apparatus 11 is unfolded, and FIG. 9 is a perspective view illustrating a state in which the display apparatus 11 is folded.

In an embodiment, the display apparatus 11 is configured to display a moving image and/or a still image. The display apparatus 11 may be used as display screens of portable electronic devices, such as mobile phones, smartphones, tablet personal computers (PCs), mobile communication terminals, electronic organizers, e-books, portable multimedia players (PMPs), navigations, and/or ultra mobile PCs (UMPCs). Also, the display apparatus 11 may be used as display screens of various products, such as televisions, laptops, monitors, billboards, and/or Internet of things (IoT) devices. In addition, the display apparatus 11 may be used in wearable devices, such as smart watches, watch phones, glasses-type displays, and/or head mounted displays (HMDs). Also, the display apparatus 11 may be used in dashboards of automobiles, center information displays (CIDs) on the center fascia or dashboards of automobiles, room mirror displays replacing side mirrors of automobiles, and/or displays on the rear sides of front seats to serve as entertainment devices for backseat passengers of automobiles.

In an embodiment, as illustrated in FIG. 8, the display apparatus 11 may be unfolded flat as a whole. In an embodiment, as illustrated in FIG. 9, the display apparatus 11 may be foldable and/or bendable.

In an embodiment, the display apparatus 11 may be folded so that the display surfaces thereof face each other. In another embodiment, the display apparatus 11 may be folded so that the display surfaces thereof face outward. The "display surface" is a surface on which an image is displayed. The display surface may include a display area DDA and a peripheral area PPA. An image may be provided to a user through the display area DDA. The term "folded" means that the shape is not fixed, but may be transformed from the original shape to another shape. The term "folded" may include "being folded, curved, or rolled along one or more specific lines, i.e., one or more folding axes."

In an embodiment and referring to FIGS. 8 and 9, the display apparatus 11 may have a display area DDA and a peripheral area PPA outside the display area DDA. The display area DDA may be an area in which a plurality of pixels P are arranged to display an image. The peripheral area PPA may surround the display area DDA and may be a non-display area in which no pixels P are arranged.

In an embodiment, the display area DDA may include a first display area DDA1 and a second display area DDA2. The first display area DDA1 may be a flexible and foldable folding area and one or more folding areas may be provided. The second display area DDA2 may be a non-folding area. In an embodiment, the area that is non-foldable is referred to as the non-folding area, but this is for convenience of description. The term "non-folding" may include a case that is hard without flexibility, a case that has flexibility less than that of a folding area, and/or a case that has flexibility but is non-foldable. The display apparatus 11 may display images on the first display area DDA1 and the second display area DDA2.

In an embodiment, the first display area DDA1 may include a first folding area FA1 and a second folding area FA2. The first folding area FA1 may be foldable with respect to the first folding axis FAX1, and the second folding area FA2 may be foldable with respect to the second folding axis FAX2. In an embodiment, the area of the first folding area FA1 may be similar to the area of the second folding area FA2. In another embodiment, the area of the first folding area FA1 may be different from the area of the second folding area FA2.

In an embodiment, the second display area DDA2 may include a first non-folding area NFA1, a second non-folding area NFA2, and a third non-folding area NFA3. The first folding area FA1 may be between the first non-folding area NFA1 and the second non-folding area NFA2, and the second folding area FA2 may be between the second non-folding area NFA2 and the third non-folding area NFA3.

In an embodiment, in the peripheral area PA, various electronic devices, printed circuit boards, etc. may be electrically attached and/or voltage lines configured to supply power for driving display elements may be located. For example, a scan driver configured to provide a scan signal to each of the pixels P, a data driver configured to provide a data signal to each of the pixels P, supply lines (a clock signal line, a carry signal line, a driving voltage line, etc.) configured to supply signals to be input to the scan driver and/or the data driver, a main power line, etc. may be arranged in the peripheral area PA.

Figure 10:
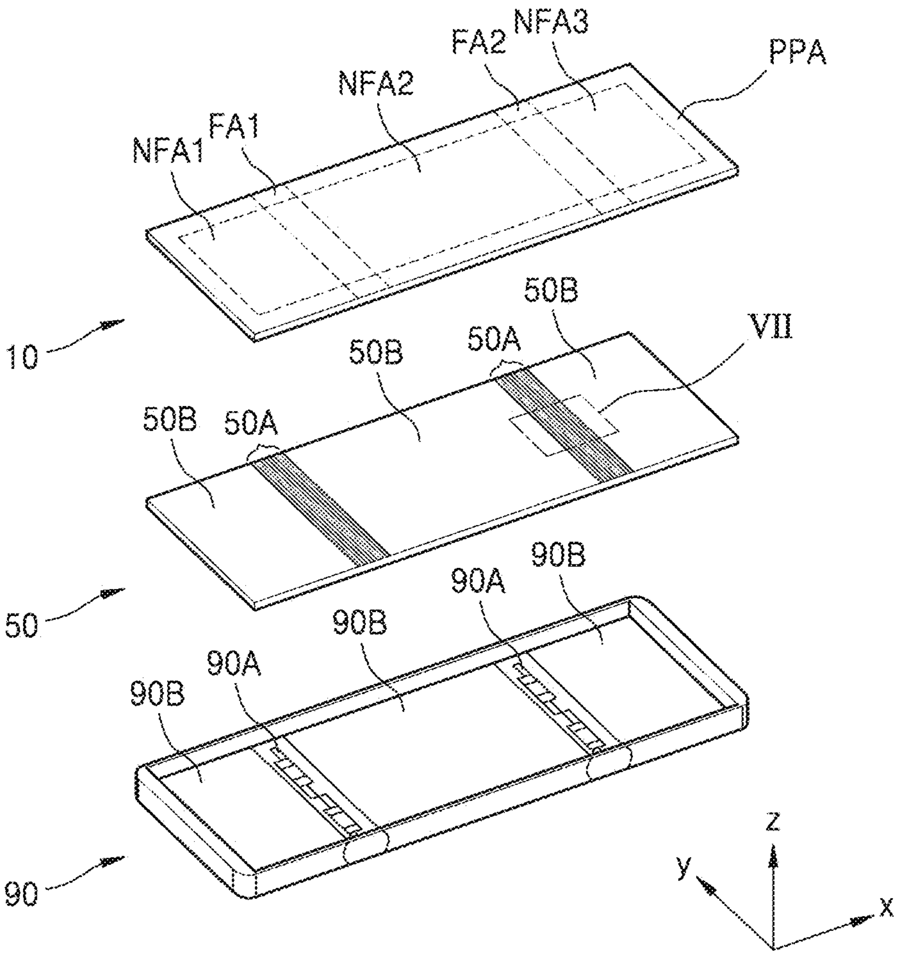
FIG. 10 is a exploded view schematically illustrating the structure of the display apparatus of FIG. 8, according to an embodiment.
Figure 11A:
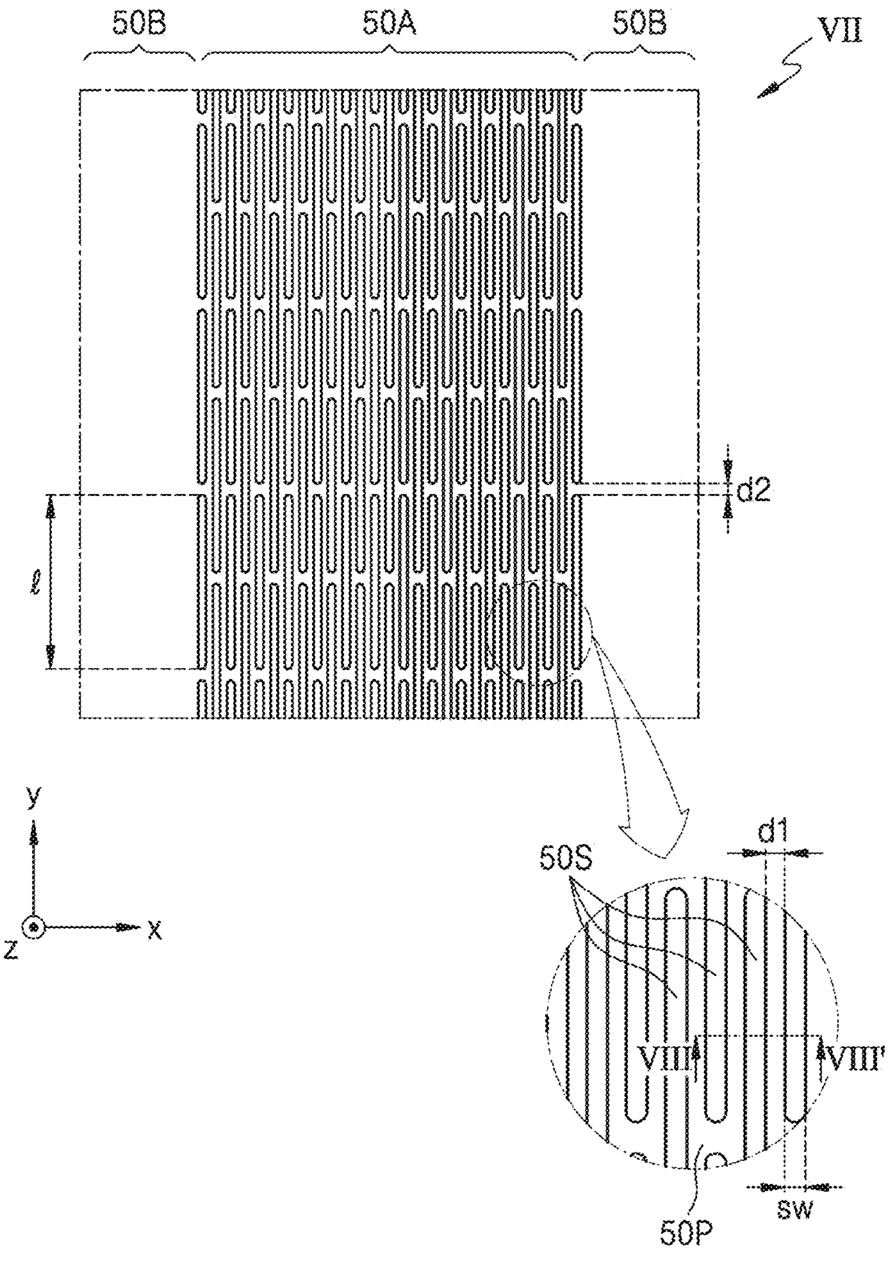
FIG. 11A is an enlarged plan view illustrating an example of region VII of a support layer of FIG. 10 according to an embodiment.
Figure 11B:
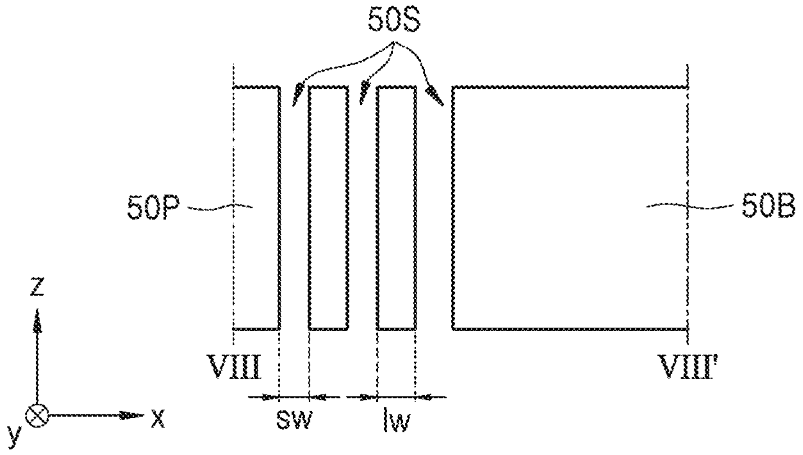
FIG. 11B is a cross-sectional view illustrating an example of a portion of the support layer of FIG. 11A taken along line VIII-VIII' according to an embodiment.
Figure 12:
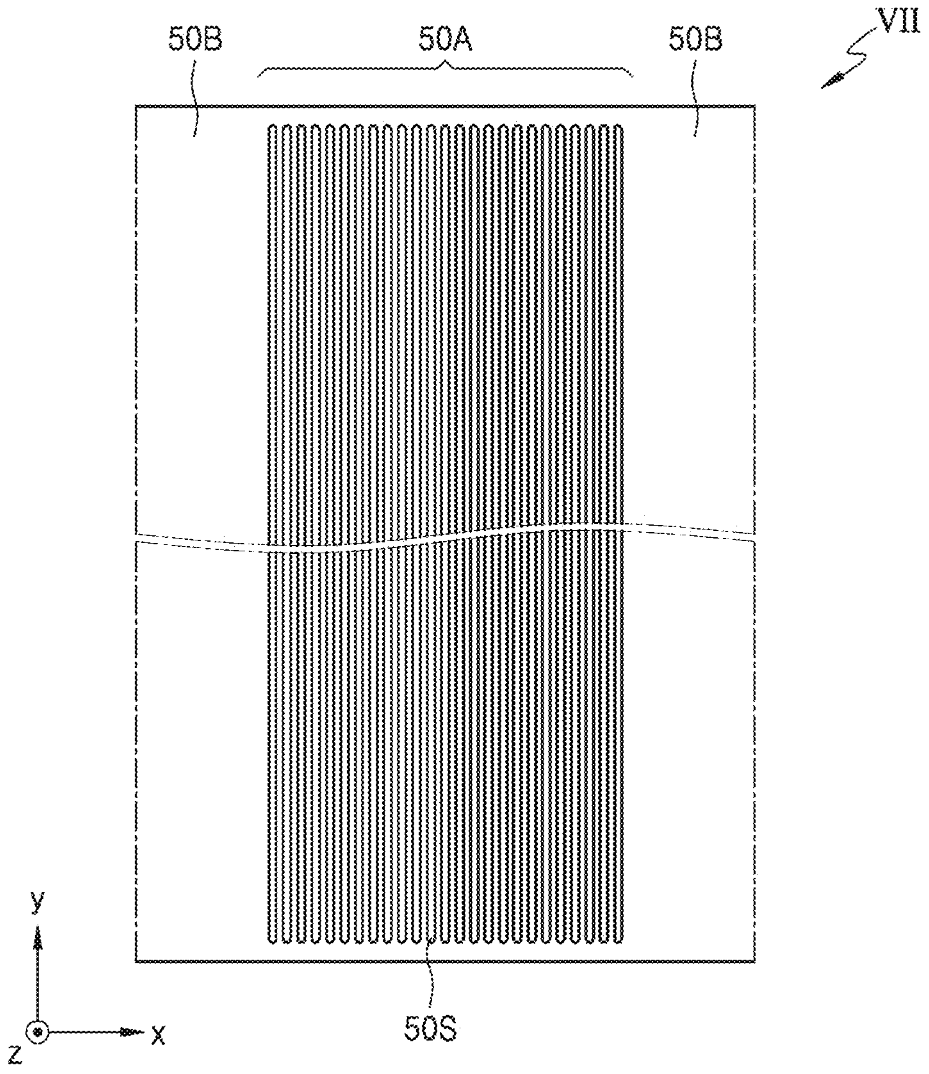
FIG. 12 is an enlarged plan view illustrating an example of region VII of a support layer of FIG. 10 according to an embodiment.
Figure 13:
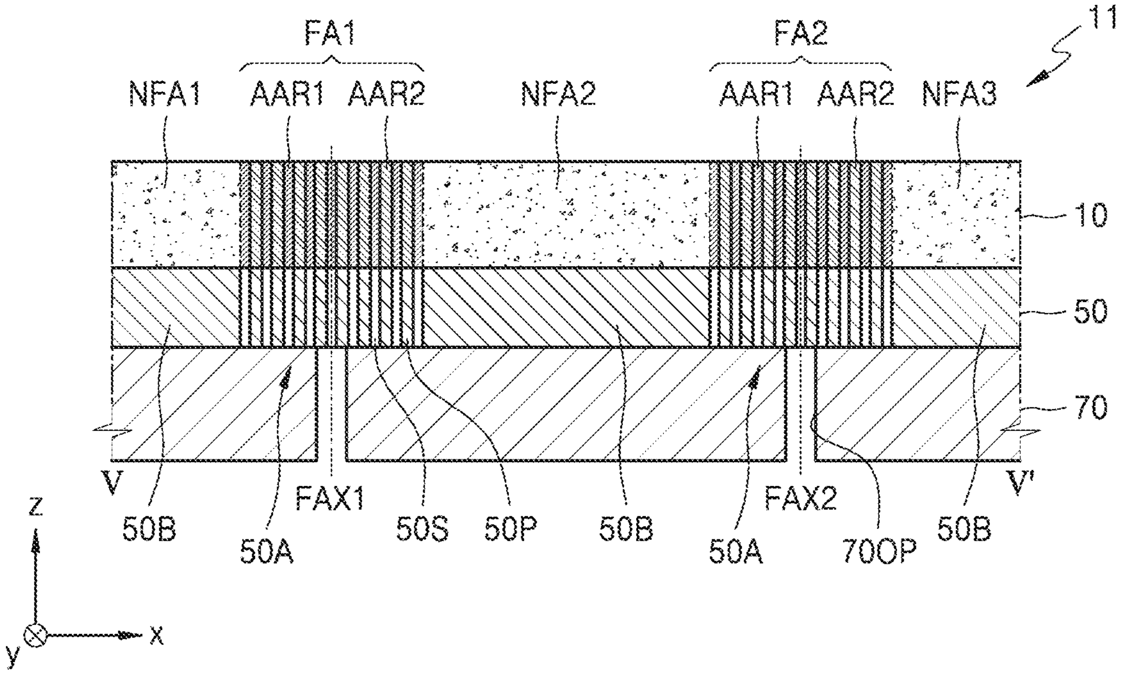
FIG. 13 is a cross-sectional view illustrating an example of a portion of the display apparatus of FIG. 8 taken along line V-V' according to an embodiment.

FIG. 10 is a diagram schematically illustrating the structure of the display apparatus 11 of FIG. 8, according to an embodiment. FIG. 11A is an enlarged plan view illustrating an example of region VII of a support layer 50 of FIG. 10, and FIG. 11B is a cross-sectional view illustrating an example of a portion of the support layer 50 of FIG. 11A taken along line VIII-VIII' according to an embodiment. FIG. 12 is an enlarged plan view illustrating an example of region VII of the support layer 50 of FIG. 10 according to an embodiment. FIG. 13 is a cross-sectional view illustrating an example of a portion of the display apparatus 11 of FIG. 8 taken along line V-V' according to an embodiment.

In an embodiment and referring to FIG. 10, the display apparatus 11 may include a display panel 10, the support layer 50, and a lower cover 90.

In an embodiment, the display panel 10 may include a display area DDA and a peripheral area PPA. The display area DDA may include a first display area DDA1 and a second display area DDA2. At least one folding area and at least one non-folding area may be defined in the display panel 10. The at least one folding area may correspond to the first display area DDA1, and the at least one non-folding area may correspond to the second display area DDA2.

In an embodiment, the first display area DDA1 may include a first folding area FA1 and a second folding area FA2. The second display area DDA2 may include a first non-folding area NFA1, a second non-folding area NFA2, and a third non-folding area NFA3. The first display area DDA1 and the second display area DDA2 may be surrounded by the peripheral area PPA.

In an embodiment and as illustrated in FIG. 13, the support layer 50 may be disposed under the display panel 10 and support the display panel 10. The support layer 50 may include a plurality of first support portions 50A and a plurality of second support portions 50B. The first support portions 50A and the second support portions 50B may be integral with each other. The first support portions 50A may correspond to (or overlap) the first folding area FA1 and the second folding area FA2 of the display panel 10, respectively. The second support portions 50B may correspond to (or overlap) the first non-folding area NFA1, the second non-folding area NFA2, and the third non-folding area NFA3 of the display panel 10, respectively. The first support portion 50A may be disposed between the second support portions 50B.

In an embodiment, the first folding area FA1 and the second folding area FA2 of the display panel 10 may each include first areas AAR1 and second areas AAR2. The first areas AAR1 of the first folding area FA1 and the second folding area FA2 may respectively correspond to (or overlap) slits 50S of the first support portion 50A, and the second areas AAR2 of the first folding area FA1 and the second folding area FA2 may respectively correspond to (or overlap) ribs 50P of the first support portion 50A. The first areas AAR1 and the second areas AAR2 may be alternately arranged in the first direction (e.g., x directions).

On the other hand, in an embodiment, as will be described below with reference to FIG. 17, the first area AAR1 of the first folding area FA1 may include first pixel areas PPXAR1 arranged at a first pitch in the first direction (e.g., ±x directions), and the second area AAR2 of the first folding area FA1 may include second pixel areas PPXAR2 arranged at a second pitch different from the first pitch in the first direction (e.g., x directions). The first non-folding area NFA1 may include third pixel areas PPXAR3 arranged at a third pitch in the first direction (e.g., ±x directions). The first pitch may be substantially equal to the third pitch. Although the description has been given based on the first folding area FA1 and the first non-folding area NFA1, the same description may also be applied to the second folding area FA2, the second non-folding area NFA2, and the third non-folding area NFA3.

In an embodiment, the support layer 50 may have various structures according to the folding or non-folding of the display apparatus 11 and the folding shape. For example, when the display apparatus 11 is not folded, the support layer 50 may have a shape that does not change and has a flat upper surface. When the display apparatus 11 is folded, the support layer 50 may be folded along with the display panel 10. The first support portions 50A may each be folded with respect to the first folding axis FAX1 and the second folding axis FAX2.

In an embodiment, the first support portions 50A may each have a certain pattern including a plurality of slits 50S. The slits 50S may be arranged in the ±y directions (the length direction, the second direction, etc.) and ±x directions perpendicular to the ±y directions (the width direction, the first direction, etc.). The slits 50S may have a length l in the ±y directions parallel to the folding axis of the folding area. For example, the slits 50S may have an oval shape with a long hole in the ±y directions.

In an embodiment, as illustrated in FIGS. 11A and 11B, the first support portions 50A may each have a grid pattern in which the slits 50S having the same length are spaced apart from each other in the ±y directions and the ±x directions. A width Iw of a grid pattern rib (or a grid line) 50P may be determined by a first interval d1 between the slits 50S in the ±x directions and a second interval d2 between the slits 50S in the ±y directions. The slits 50S may be arranged at regular or irregular intervals in the ±y directions and/or the ±x directions. The slits 50S may have the same shape or different shapes. The degree of flexibility of the first support portion 50A may be determined by at least one of the length l of the slit 50S. The width sw of the slit 50S, the first interval d1 between the slits 50S, or the second interval d2 between the slits 50S. In another embodiment, as illustrated in FIG. 12, the first support portions 50A may each have a slit pattern in which the slits 50S having the same length are spaced apart in parallel in the ±x directions. The slit pattern ribs 50P and the slits 50S may alternate in the ±x directions.

The support layer 50 may include at least one of glass, plastic, or metal. In an embodiment, the support layer 50 may include polyurethane and/or carbon fiber reinforced plastic. In an embodiment, the support layer 50 may include at least one of stainless steel, invar, nickel (Ni), cobalt (Co), a nickel alloy, and/or a nickel-cobalt alloy. In an embodiment, the support layer 50 may include austenitic stainless steels.

In an embodiment and as illustrated in FIG. 13, a cushion layer 70 may be disposed under the support layer 50. The cushion layer 70 may prevent or minimize damage to the support layer 50 and the display panel 10 may be disposed on the cushion layer 70 due to external impact. In an embodiment, the cushion layer 70 may have an opening 700P with respect to the folding axis.

In an embodiment and referring to FIG. 10, the lower cover 90 may form the outer appearance of the lower surface of the display apparatus 11. The lower cover 90 may include plastic, metal, or both plastic and metal. The lower cover 90 may include first display areas DDA1, which are folding areas of the display panel 10, hinge areas 90A overlapping the first support portions 50A of the support layer 50, and flat portions 90B. The flat portion 90B may overlap second display areas DDA2, which are non-folding areas of the display panel 10, and second support portions 50B of the support layer 50. The hinge areas 90A of the lower cover 90 may be foldable with respect to the first folding axis FAX1 and the second folding axis FAX2.

Figure 14:
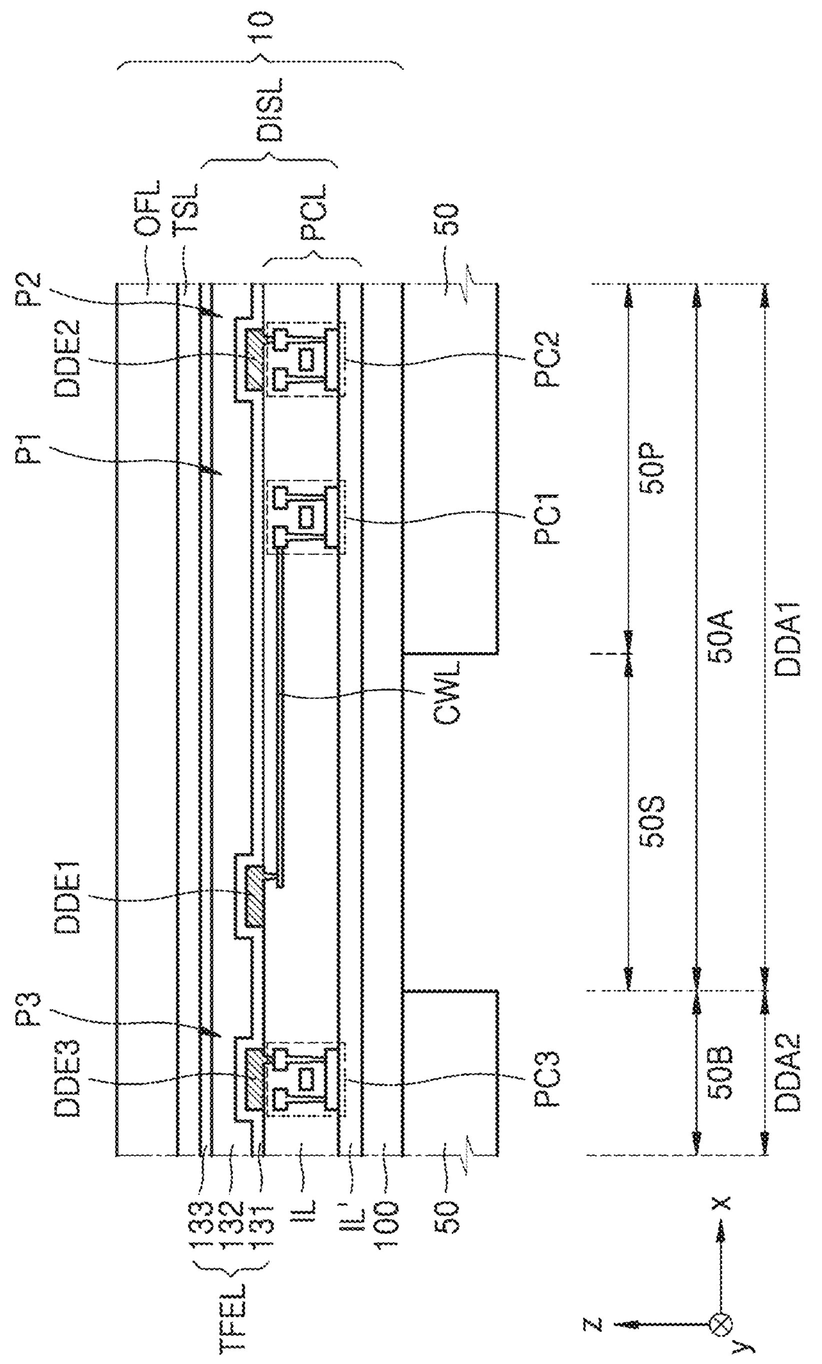
FIG. 14 is a cross-sectional view schematically illustrating a portion of a display apparatus, according to an embodiment.

FIG. 14 is a cross-sectional view schematically illustrating a portion of a display apparatus 11, according to an embodiment.

In an embodiment and referring to FIG. 14, the display apparatus 11 may include a display panel 10 and a support layer 50 overlapping the display panel 10. A cover window (not shown) may be further disposed above the display panel 10 so as to protect the display panel 10.

In an embodiment, the display panel 10 may include a substrate 100, and a display layer DISL, a touch sensor layer TSL, and an optical functional layer OFL on the substrate 100. The display panel 10 may include a first display area DDA1 and a second display area DDA2. The first display area DDA1 may be a folding area, and one or more folding areas may be provided. The second display area DDA2 may be a non-folding area.

In an embodiment, the substrate 100 may include an insulating material, such as glass, quartz, and/or polymer resin. The substrate 100 may be a flexible substrate that is bendable, foldable, and/or rollable.

In an embodiment, the display layer DISL may include a circuit layer PCL, display elements disposed on the circuit layer PCL, and an encapsulation layer, such as a thin-film encapsulation layer TFEL and/or a sealing substrate (not shown). Insulating layers IL and IL' may be disposed between the substrate 100 and the display layer DISL and may be disposed inside the display layer DISL. In an embodiment, the display element may be an organic light-emitting diode including an organic emission layer. Alternatively, the display element may be a light-emitting diode (LED). The size of the LED may be on a micro scale or a nano scale. For example, the LED may be a micro LED. Alternatively, the LED may be a nanorod LED. The nanorod LED may include gallium nitride (GaN). In an embodiment, a color conversion layer may be disposed on the nanorod LED. The color conversion layer may include quantum dots. Alternatively, the display element may be a quantum dot LED including a quantum dot emission layer. Alternatively, the display element may be an inorganic LED including an inorganic semiconductor.

In an embodiment, the first display area DDA1 of the display panel 10 may correspond to the first support portion 50A of the support layer 50, and the second display area DDA2 of the display panel 10 may correspond to the second support portion 50B of the support layer 50.

In an embodiment, a first pixel P1 and a second pixel P2 may be in the first display area DDA1. The first pixel P1 may include a first pixel circuit PC1 disposed to correspond to (or overlap) the rib 50P of the first support portion 50A, and a first display element DDE1 connected to the first pixel circuit PC1 and disposed to correspond to (or overlap) the slit 50S. That is, the first pixel circuit PC1 may not be in an area corresponding to the slit 50S of the first display area DDA1. The first pixel circuit PC1 may include at least one thin-film transistor and may control light emission of the first display element DDE1. The first pixel circuit PC1 may be connected to the first display element DDE1 through a connection line CWL. The connection line CWL may overlap the slit 50S and the rib 50P of the first support portion 50A. The second pixel P2 may include a second pixel circuit PC2 disposed to correspond to (or overlap) the rib 50P of the first support portion 50A, and a second display element DDE2 connected to the second pixel circuit PC2. The second pixel circuit PC2 may include at least one thin-film transistor and may control light emission of the second display element DDE2.

In an embodiment, a third pixel P3 may be disposed in the second display area DDA2 of the display panel 10. The third pixel P3 may include a third pixel circuit PC3 and a third display element DDE3 connected to the third pixel circuit PC3. The third pixel circuit PC3 may include at least one thin-film transistor and may control light emission of the third display element DDE3.

In an embodiment, the encapsulation layer may be disposed on the display elements. The display elements may be covered with the thin-film encapsulation layer TFEL or the sealing substrate.

In an embodiment, the thin-film encapsulation layer TFEL may include at least one inorganic encapsulation layer and at least one organic encapsulation layer. In an embodiment, the thin-film encapsulation layer TFEL may include a first inorganic encapsulation layer 131, an organic encapsulation layer 132, and a second inorganic encapsulation layer 133, which are sequentially stacked in this stated order. The first inorganic encapsulation layer 131 and the second inorganic encapsulation layer 133 may each include at least one inorganic insulating material selected from silicon oxide ($SiO_X$), silicon nitride ($SiN_x$), silicon oxynitride ($SiO_xN_y$), aluminum oxide ($Al_2O_3$), titanium oxide ($TiO_2$), tantalum oxide ($Ta_2O_5$), and/or hafnium oxide ($HfO_2$). The organic encapsulation layer 132 may include a polymer-based material. The polymer-based material may include acrylic resin, epoxy-based resin, polyimide, polyethylene, and/or the like.

In another embodiment, the sealing substrate may be disposed to face the substrate 100 with the display elements therebetween. An internal space between the substrate 100 and the sealing substrate may be sealed by coupling the substrate 100 to the sealing substrate with a sealing member. The sealing substrate may be a flexible substrate. The sealing member may be a sealant. In another embodiment, the sealing member may include a material that is cured by a laser. For example, the sealing member may be frit.

In an embodiment, the touch sensor layer TSL may be configured to obtain coordinate information according to an external input, for example, a touch event. The touch sensor layer TSL may include a touch electrode and/or sensing lines connected to the touch electrode. The touch sensor layer TSL may sense an external input by using a self-capacitance method and/or a mutual capacitance method. The touch sensor layer TSL may be disposed on the thin-film encapsulation layer TFEL. Alternatively, the touch sensor layer TSL may be separately formed on a touch substrate and then connected to the thin-film encapsulation layer TFEL through an adhesive layer, such as an optically clear adhesive (OCA). In an embodiment, the touch sensor layer TSL may be formed directly on the thin-film encapsulation layer TFEL. In this case, the adhesive layer may not be disposed between the touch sensor layer TSL and the thin-film encapsulation layer TFEL.

In an embodiment, the optical functional layer OFL may include an anti-reflection layer. The anti-reflection layer may reduce the reflectance of light (external light) incident from the outside toward the display apparatus 11. In some embodiments, the optical functional layer OFL may be a polarizing film. In some embodiments, the optical functional layer OFL may be a filter support layer including a black matrix and color filters.

Figure 15:
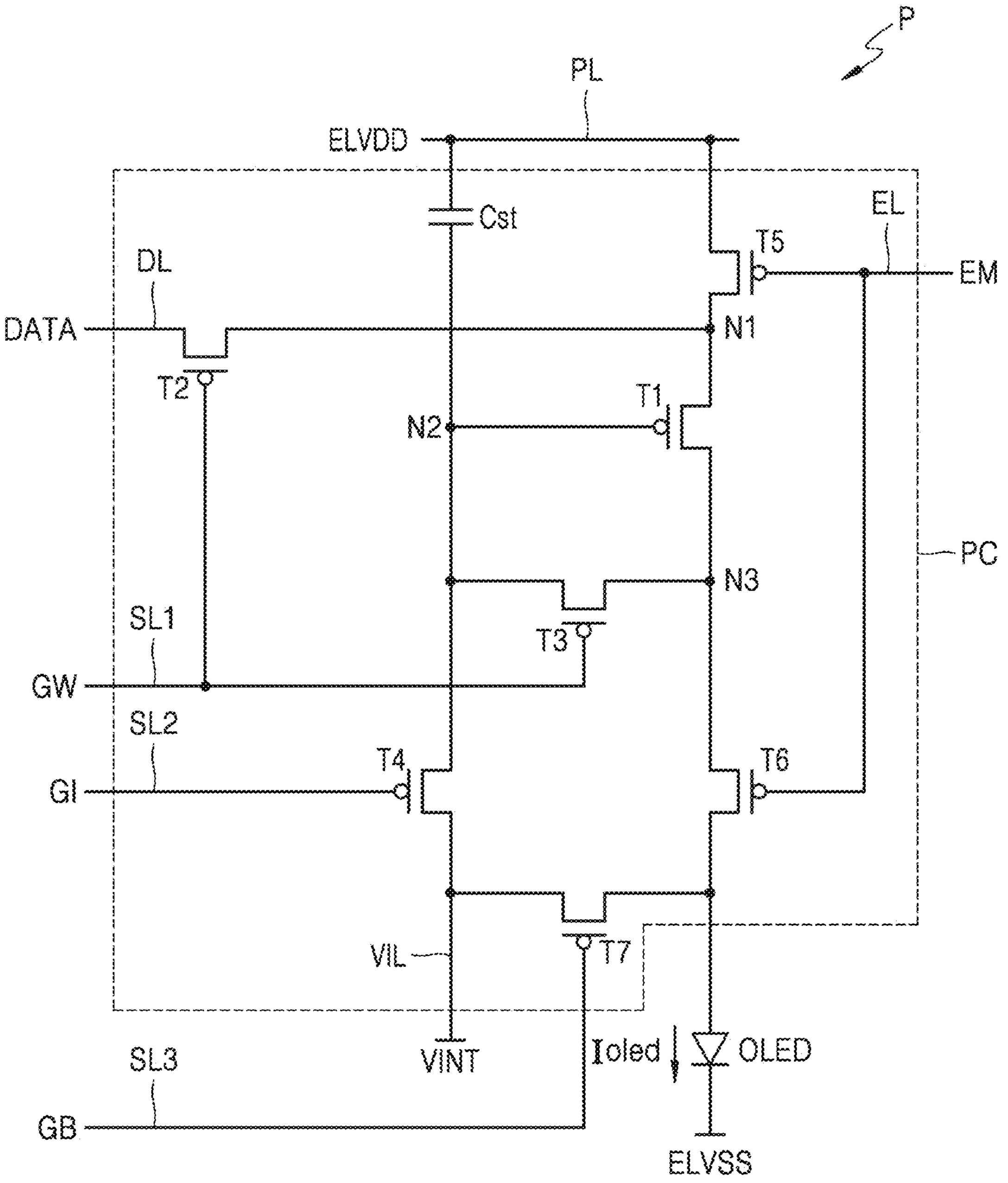
FIG. 15 is an equivalent circuit diagram of a pixel included in the display apparatus of FIG. 8 according to an embodiment.

FIG. 15 is an equivalent circuit diagram of a pixel P included in the display apparatus 11 of FIG. 8 according to an embodiment.

In an embodiment and referring to FIG. 15, a pixel circuit PC may include first to seventh transistors T1 to T7, respectively. A first terminal of a transistor may be a source electrode or a drain electrode, and a second terminal may be an electrode different from the first terminal, according to a type (N-type or P-type) of transistor and/or an operating condition. For example, when the first terminal is a source electrode, the second terminal may be a drain electrode.

In an embodiment, the pixel circuit PC may be connected to a first scan line SL1 configured to transmit a first scan signal GW, a second scan line SL2 configured to transmit a second scan signal GI, a third scan line SL3 configured to transmit a third scan signal GB, an emission control line EL configured to transmit an emission control signal EM, a data line DL configured to transmit a data signal DATA, a driving voltage line PL configured to transmit a driving voltage ELVDD, and an initialization voltage line VIL configured to transmit an initialization voltage VINT. The pixel circuit PC may be connected to an organic light-emitting diode OLED as a display element.

In an embodiment, the first transistor T1 may be connected between the driving voltage line PL and the organic light-emitting diode OLED. The first transistor T1 may be connected between a first node N1 and a third node N3. The first transistor T1 may be connected to the driving voltage line PL via the fifth transistor T5 and may be electrically connected to the organic light-emitting diode OLED via the sixth transistor T6. The first transistor T1 may include a gate electrode connected to the second node N2, a first terminal connected to the first node N1, and a second terminal connected to the third node N3. The driving voltage line PL may be configured to transmit the driving voltage ELVDD to the first transistor T1. The first transistor T1 may act as a driving transistor and may be configured to receive the data signal DATA according to the switching operation of the second transistor T2 and supply a driving current $I_{oled}$ to the organic light-emitting diode OLED.

In an embodiment, the second transistor (or data write transistor) T2 may be connected between the data line DL and the first node N1. The second transistor T2 may be connected to the driving voltage line PL via the fifth transistor T5. The second transistor T2 may include a gate electrode connected to the first scan line SL1, a first terminal connected to the data line DL, and a second terminal connected to the first node N1. The second transistor T2 may be configured to be turned on in response to the first scan signal GW received through the first scan line SL1 and perform a switching operation to transmit the data signal DATA received through the data line DL to the node N1.

In an embodiment, the third transistor (or compensation transistor) T3 may be connected between the second node N2 and the third node N3. The third transistor T3 may be connected to the organic light-emitting diode OLED via the sixth transistor T6. The third transistor T3 may include a gate electrode connected to the first scan line SL1, a first terminal connected to the second node N2, and a second terminal connected to the third node N3. The third transistor T3 may be configured to be turned on in response to the first scan signal GW received through the first scan line SL1 and compensate for a threshold voltage of the first transistor T1 by diode-connecting the first transistor T1.

In an embodiment, the fourth transistor (or first initialization transistor) T4 may be connected between the second node N2 and the initialization voltage line VIL. The fourth transistor T4 may include a gate electrode connected to the second scan line SL2, a first terminal connected to the second node N2, and a second terminal connected to the initialization voltage line VIL. The fourth transistor T4 may be configured to be turned on in response to the second scan signal GI received through the second scan line SL2 and initialize the gate electrode of the first transistor T1 by transmitting the initialization voltage VINT to the gate electrode of the first transistor T1.

In an embodiment, the fifth transistor (or first emission control transistor) T5 may be connected between the driving voltage line PL and the first node N1. The sixth transistor (or second emission control transistor) T6 may be connected between the third node N3 and the organic light-emitting diode OLED. The fifth transistor T5 may include a gate electrode connected to the emission control line EL, a first terminal connected to the driving voltage line PL, and a second terminal connected to the first node N1. The sixth transistor T6 may include a gate electrode connected to the emission control line EL, a first terminal connected to the third node N3, and a second terminal connected to a pixel electrode of the organic light-emitting diode OLED. The fifth transistor T5 and the sixth transistor T6 may be configured to be simultaneously turned on in response to the emission control signal EM received through the emission control line EL, so that the driving current $I_{oled}$ flows through the organic light-emitting diode OLED.

In an embodiment, the seventh transistor (or second initialization transistor) T7 may be connected between the organic light-emitting diode OLED and the initialization voltage line VIL. The seventh transistor T7 may include a gate electrode connected to the third scan line SL3, a first terminal connected to a second terminal of the sixth transistor T6 and the pixel electrode of the organic light-emitting diode OLED, and a second terminal connected to the initialization voltage line VIL. The seventh transistor T7 may be configured to be turned on in response to the third scan signal GB received through the third scan line SL3 and initialize the pixel electrode of the organic light-emitting diode OLED by transmitting the initialization voltage VINT to the pixel electrode of the organic light-emitting diode OLED.

In an embodiment, a capacitor Cst may include a first electrode connected to the gate electrode of the first transistor T1 and a second electrode connected to the driving voltage line PL. The capacitor Cst may store and maintain a voltage corresponding to a voltage difference between the driving voltage line PL and the gate electrode of the first transistor T1, and thus, a voltage applied to the gate electrode of the first transistor T1 may be maintained.

In an embodiment, the organic light-emitting diode OLED may include the pixel electrode (first electrode, anode, etc.) and an opposite electrode (second electrode, cathode, etc.). The opposite electrode may be configured to receive a common voltage ELVSS. The organic light-emitting diode OLED may be configured to receive the driving current $I_{oled}$ from the first transistor T1 and emit light to display an image.

In an embodiment, FIG. 15 illustrates that the first to seventh transistors T1 to T7, respectively, are P-type transistors. The disclosure is not limited thereto. For example, the first to seventh transistors T1 to T7, respectively, may be N-type transistors. Alternatively, some of the first to seventh transistors T1 to T7, respectively, may be N-type transistors, and the others thereof may be P-type transistors. For example, the third transistor T3 and the fourth transistor T4 among the first to seventh transistors T1 to T7, respectively, may be N-type transistors, and the others thereof may be P-type transistors. The third transistor T3 and the fourth transistor T4 may each include a semiconductor layer including oxide, and the others may each include a semiconductor layer including silicon.

On the other hand, in an embodiment, a case where the organic light-emitting diode is employed as the display element is described as an example, but in another embodiment, an inorganic light-emitting element or a quantum dot light-emitting element may be employed as the display element.

Figure 16:
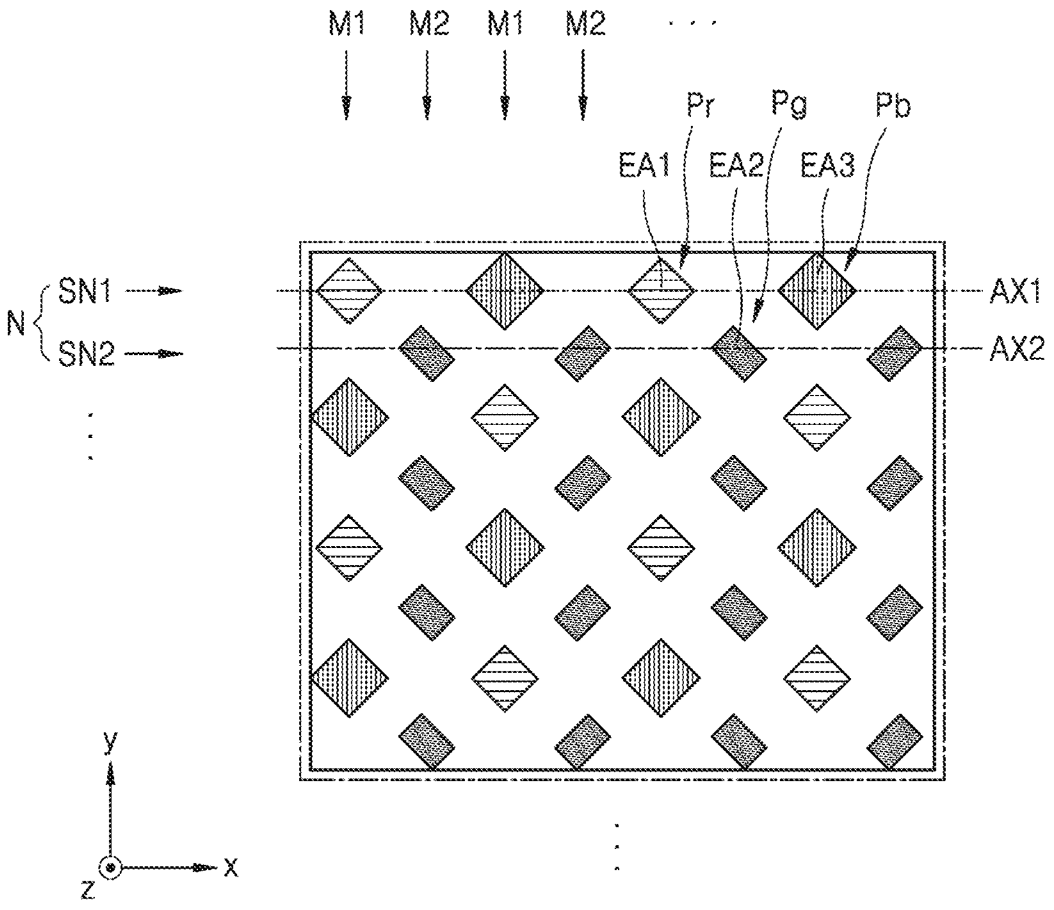
FIG. 16 is a diagram illustrating a schematic arrangement of emission areas of a plurality of pixels in a display area, according to an embodiment.

FIG. 16 is a diagram illustrating a schematic arrangement of emission areas of a plurality of pixels in a display area DAA (see FIG. 8), according to an embodiment.

In an embodiment and referring to FIG. 16, the pixels arranged in the display area DDA (see FIG. 8) may include a first sub-pixel Pr configured to emit first color light, a second sub-pixel Pg configured to emit second color light, and a third sub-pixel Pb configured to emit third color light. In an embodiment, the first sub-pixel Pr may be a red pixel configured to emit red light, the second sub-pixel Pg may be a green pixel configured to emit green light, and the third sub-pixel Pb may be a blue pixel configured to emit blue light.

In an embodiment, in a first display area DDA1 (see FIG. 8) and a second display area DDA2 (see FIG. 8), the first sub-pixel Pr, the second sub-pixel Pg, and the third sub-pixel Pb may be repeatedly arranged in the ±x directions and the ±y directions according to a certain pattern. The first sub-pixel Pr, the second sub-pixel Pg, and the third sub-pixel Pb may each include a pixel circuit and a display element electrically connected to the pixel circuit. In an embodiment, the display element may be an OLED.

In an embodiment, an emission area of each of the first sub-pixel Pr, the second sub-pixel Pg, and the third sub-pixel Pb may be an area in which an emission layer of the OLED is arranged. The emission area may be defined by an opening of a pixel defining layer.

In an embodiment, in a first column M1, a first emission area EA1 of the first sub-pixel Pr and a third emission area EA3 of the third sub-pixel Pb may be alternately arranged in the ±y directions. In a second column M2, a second emission area EA2 of the second sub-pixel Pg may be repeatedly arranged in the ±y directions. The first column M1 and the second column M2 may alternate in the ±x directions, and the arrangements of the first emission area EA1 of the first sub-pixel Pr and the third emission area EA3 of the third sub-pixel Pb in the first columns M1 adjacent to each other may be opposite to each other.

In an embodiment, in a first sub-row SN1 of each row N, the first emission area EA1 of the first sub-pixel Pr and the third emission area EA3 of the third sub-pixel Pb may be alternately arranged along a first virtual line ll1 in the ±x directions. In a second sub-row SN2 of each row N, the second emission area EA2 of the second sub-pixel PX2 may be repeatedly arranged along a second virtual line ll2 in the ±x directions. That is, in each row N, the first emission area EA1 of the first sub-pixel Pr, the second emission area EA2 of the second sub-pixel Pg, the third emission area EA3 of the third sub-pixel Pb, and the second emission area EA2 of the sub-pixel Pg may be repeatedly arranged in a zigzag manner.

In an embodiment, the first emission area EA1 of the first sub-pixel Pr, the second emission area EA2 of the second sub-pixel Pg, and the third emission area EA3 of the third sub-pixel Pb may have different areas from each other. In an embodiment, the area of the third emission area EA3 of the third sub-pixel Pb may be greater than the area of the first emission area EA1 of the first sub-pixel Pr. Also, the area of the third emission area EA3 of the third sub-pixel Pb may be greater than the area of the second emission area EA2 of the second sub-pixel Pg. The area of the first emission area EA1 of the first sub-pixel Pr may be greater than the area of the second emission area EA2 of the second sub-pixel Pg. In another embodiment, the area of the third emission area EA3 of the third sub-pixel Pb may be equal to the area of the first emission area EA1 of the first sub-pixel Pr. However, the disclosure is not limited thereto. Various embodiments are possible. For example, the area of the first emission area EA1 of the first sub-pixel Pr may be greater than the areas of the second emission area EA2 of the second sub-pixel Pg and the third emission area EA3 of the third sub-pixel Pb.

In an embodiment, the first to third emission areas EA1, EA2, and EA3 may each have a polygonal shape, such as a rectangular shape or an octagonal shape, a circular shape, an elliptical shape, and/or the like. The polygonal shape may include a shape with round corners (or vertices).

Figure 17:
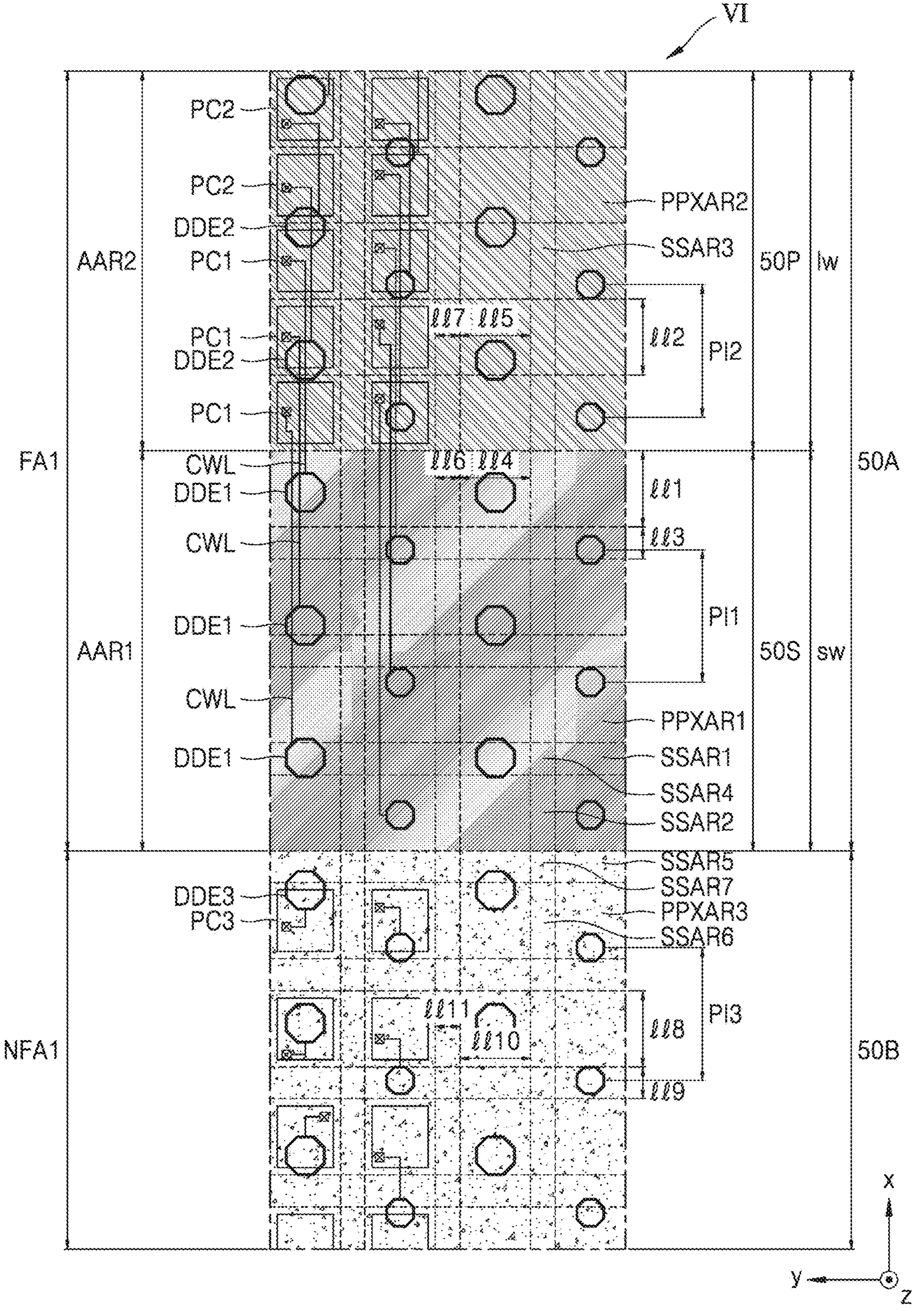
FIG. 17 is an enlarged plan view illustrating an example of region VI of FIG. 8 according to an embodiment.

FIG. 17 is an enlarged plan view illustrating an example of region VI of FIG. 8 according to an embodiment. FIG. 17 is a diagram illustrating the connection between the pixel circuit and the display element in the folding area and the non-folding area, according to an embodiment. The first folding area FA1 and the first non-folding area NFA1 are mainly described with reference to FIG. 17, but the same description may also be applied to the second folding area FA2, the second non-folding area NFA2, and the third non-folding area NFA3.

In an embodiment and referring to FIG. 17 and FIG. 10, the display area DDA of the display panel 10 may include the first folding area FA1 and the first non-folding area NFA1. The first folding area FA1 may correspond to (or overlap) the first support portion 50A of the support layer 50. The first non-folding area NFA1 may correspond to (or overlap) the second support portion 50B of the support layer 50. The first non-folding area NFA1 may correspond to (or overlap) the second support portion 50B of the support layer 50. The first area AAR1 may correspond to (or overlap) the slit 50S of the first support portion 50A of the support layer 50. The second area AAR2 may correspond to (or overlap) the rib 50P of the first support portion 50A of the support layer 50. The first area AAR1 may have a size corresponding to the width sw of the slit 50S of the support layer 50, and the second area AAR2 may have a size corresponding to the width Iw of the rib 50P of the support layer 50. For example, the length of the first area AAR1 in the first direction (e.g., x directions) may correspond to the width sw of the slit 50S of the support layer 50, and the length of the second area AAR2 in the first direction (e.g., x directions) may correspond to the width Iw of the rib 50P of the support layer 50.

In an embodiment, the display area DDA of the display panel 10 may include a plurality of pixel areas and a plurality of separation areas. For example, the first area AAR1 of the first folding area FA1 may include first pixel areas PPXAR1, first separation areas SSAR1, second separation areas SSAR2, and fourth separation areas SSAR4. The second area AAR2 of the first folding area FA1 may include second pixel areas PPXAR2 and third separation areas SSAR3. The first non-folding area NFA1 may include third pixel areas PPXAR3, fifth separation areas SSAR5, sixth separation areas SSAR6, and seventh separation areas SSAR7.

In an embodiment, the first pixel areas PPXAR1 may be arranged in the first direction (e.g., x directions) and the second direction (e.g., ±y directions). The first pixel areas PPXAR1 may be spaced apart from each other. The first separation areas SSAR1 may be between the first pixel areas PPXAR1 adjacent to each other in the first direction (e.g., x directions). The first pixel areas PPXAR1 and the first separation areas SSAR1 may be alternately arranged in the first direction (e.g., ±x directions). The second separation areas SSAR2 may be between the first pixel areas PPXAR1 adjacent to each other in the second direction (e.g., ±y directions). The first pixel areas PPXAR1 and the second separation areas SSAR2 may be alternately arranged in the second direction (e.g., ±y direction). The fourth separation areas SSAR4 may be surrounded by the first separation areas SSAR1 and the second separation areas SSAR2. The fourth separation areas SSAR4 and the first separation areas SSAR1 may be alternately arranged in the second direction (e.g., ±y directions), and the fourth separation areas SSAR4 and the second separation areas SSAR2 may be alternately arranged in the first direction (e.g., ±x directions).

In an embodiment, the second pixel areas PPXAR2 may be arranged in the first direction (e.g., x directions) and the second direction (e.g., ±y directions). The second pixel areas PPXAR2 arranged in the first direction (e.g., ±x directions) may be adjacent to each other, and the second pixel areas PPXAR2 arranged in the second direction (e.g., ±x directions) may be spaced apart from each other. The third separation areas SSAR3 may be between the second pixel areas PPXAR2 adjacent to each other in the second direction (e.g., ±y directions). The second pixel areas PPXAR2 and the third separation areas SSAR3 may be alternately arranged in the second direction (e.g., ±y direction).

In an embodiment, the third pixel areas PPXAR3 may be arranged in the first direction (e.g., x directions) and the second direction (e.g., ±y directions). The third pixel areas PPXAR3 may be spaced apart from each other. The fifth separation areas SSAR5 may be between the third pixel areas PPXAR3 adjacent to each other in the first direction (e.g., x directions). The third pixel areas PPXAR3 and the fifth separation areas SSAR5 may be alternately arranged in the first direction (e.g., ±x directions). The sixth separation areas SSAR6 may be between the third pixel areas PPXAR3 adjacent to each other in the second direction (e.g., ±y directions). The third pixel areas PPXAR3 and the sixth separation areas SSAR6 may be alternately arranged in the second direction (e.g., ±y direction). The seventh separation areas SSAR7 may be surrounded by the fifth separation areas SSAR5 and the sixth separation areas SSAR6. The seventh separation areas SSAR7 and the fifth separation areas SSAR5 may be alternately arranged in the second direction (e.g., ±y directions), and the seventh separation areas SSAR7 and the sixth separation areas SSAR6 may be alternately arranged in the first direction (e.g., ±x directions).

In an embodiment, a first length ll1 of each of the first pixel areas PPXAR1 in the first direction (e.g., ±x directions) may be substantially equal to a second length ll2 of each of the second pixel areas PPXAR2 in the first direction (e.g., ±x directions). An eighth length ll8 of each of the third pixel area PPXAR3 in the first direction (e.g., ±x directions) may be substantially equal to the first length ll1. A third length ll3 of each of the first separation areas SSAR1 in the first direction (e.g., x directions) may be less than the first length ll1. A ninth length ll9 of each of the fifth separation areas SSAR5 in the first direction (e.g., x directions) may be less than the eighth length ll8.

In an embodiment, a fourth length ll4 of each of the first pixel areas PPXAR1 in the second direction (e.g., ±y directions) may be substantially equal to a fifth length ll5 of each of the second pixel areas PPXAR2 in the second direction (e.g., ±y directions). A tenth length ll10 of each of the third pixel areas PPXAR3 in the second direction (e.g., y directions) may be substantially equal to the fourth length ll4. A sixth length ll6 of each of the second separation areas SSAR2 in the second direction (e.g., ±y directions) may be less than the fourth length ll4. A seventh length ll7 of each of the third separation areas SSAR3 in the second direction (e.g., ±y directions) may be substantially equal to the sixth length 6. An eleventh length ll11 of each of the sixth separation areas SSAR6 in the second direction (e.g., ±y directions) may be substantially equal to the sixth length 6.

In an embodiment, the pixel circuit of the pixel may be in some pixel areas. For example, first pixel circuits PC1 may be respectively disposed on some of the second pixel areas PPXAR2. The second pixel circuits PC2 may be respectively disposed on others of the second pixel areas PPXAR2. Third pixel circuits PC3 may be respectively disposed on the third pixel areas PPXAR3. Pixel circuits may not be in the first area AAR1 of the first folding area FA1 corresponding to the slit 50S of the support layer 50.

In an embodiment, as a comparative example, a pixel circuit may be disposed on the substrate corresponding to the slit of the support layer. In this case, when external force is applied to the display apparatus, external impact may pass through the slit of the support layer and directly reach the pixel circuit on the substrate. The pixel circuit may be damaged by the external impact, and the display element connected to the pixel circuit may not be normally driven.

According to an embodiment, pixel circuits may not be in the first area AAR1 of the first folding area FA1 corresponding to the slit 50S of the support layer 50. In this case, even when external impact passes through the slit 50S of the support layer 50 and reaches the display panel 10, defects in the pixel circuit due to external impact may be prevented or minimized because there is no pixel circuit overlapping the slit 50S of the support layer 50.

In an embodiment, the sizes of the first to third pixel circuits PC1, PC2, and PC3, respectively, may be substantially equal to each other. When the sizes of the first to third pixel circuits PC1, PC2, and PC3, respectively in different areas are equal to each other, noise generation in signal transmission between the different areas may be reduced.

In an embodiment, signal lines connected to the pixel circuit may be in the pixel area and the separation area. For example, the first scan line SL1, the second scan line SL2, the third scan line SL3, the emission control line EL, the data line DL, the driving voltage line PL, and the initialization voltage line VIL of FIG. 15 may be in the pixel area and the separation area.

In an embodiment, the display element may be disposed above the pixel circuit. The display element may be disposed directly on the connected pixel circuit so as to overlap the pixel circuit, or may be disposed to partially overlap a pixel circuit of another pixel arranged in an adjacent row and/or column offset from the pixel circuit. Alternatively, the display element may be disposed not to overlap the connected pixel circuit. For example, the first display elements DDE1 may be in the first area AAR1 of the first folding area FA1, the second display elements DDE2 may be in the second area AAR2 of the first folding area FA1, and the third display elements DDE3 may be in the first non-folding area NFA1. The first display elements DDE1 may be electrically connected to the first pixel circuits PC1 arranged in the second area AAR2 of the first folding area FA1 through the connection lines CWL, respectively. The first display elements DDE1 may not overlap the first pixel circuits PC1. The second display elements DDE2 may be electrically connected to the second pixel circuits PC2 arranged in the second area AAR2 of the first folding area FA1, respectively. The second display element DDE2 may be disposed directly on the connected second pixel circuit PC2 so as to overlap the second pixel circuit PC2, and may be disposed to partially overlap another second pixel circuit PC2 or first pixel circuit PC1 arranged in an adjacent row and/or column offset from the connected second pixel circuit PC2. The third display elements DDE3 may be electrically connected to the third pixel circuits PC3 arranged in the first non-folding area NFA1, respectively. The third display element DDE3 may be disposed directly on the connected third pixel circuit PC3 so as to overlap the third pixel circuit PC3, and may be disposed to partially overlap another third pixel circuit PC3 arranged in an adjacent row and/or column offset from the connected third pixel circuit PC3.

In an embodiment, the number of first display elements DDE1 in the first area AAR1 of the first folding area FA1 in the first direction (e.g., ±x directions) may be determined according to the width sw of the slit 50S of the support layer 50, and the number of second display elements DDE2 in the second area AAR2 of the first folding area FA1 in the first direction (e.g., ±x directions) may be determined according to the width Iw of the rib 50P of the support layer 50.

In an embodiment, a first interval PI1 between the first display elements DDE1 adjacent to each other in the first direction (e.g., ±x directions) among the first display elements DDE1 may be substantially equal to a second interval PI2 between the second display elements DDE2 adjacent to each other in the first direction (e.g., ±x directions) among the second display elements DDE2. The first interval PI1 between the first display elements DDE1 adjacent to each other in the first direction (e.g., ±x directions) among the first display elements DDE1 may be substantially equal to a third interval PI3 between the third display elements DDE3 adjacent to each other in the first direction (e.g., ±x directions) among the third display elements DDE3.

Figure 18:
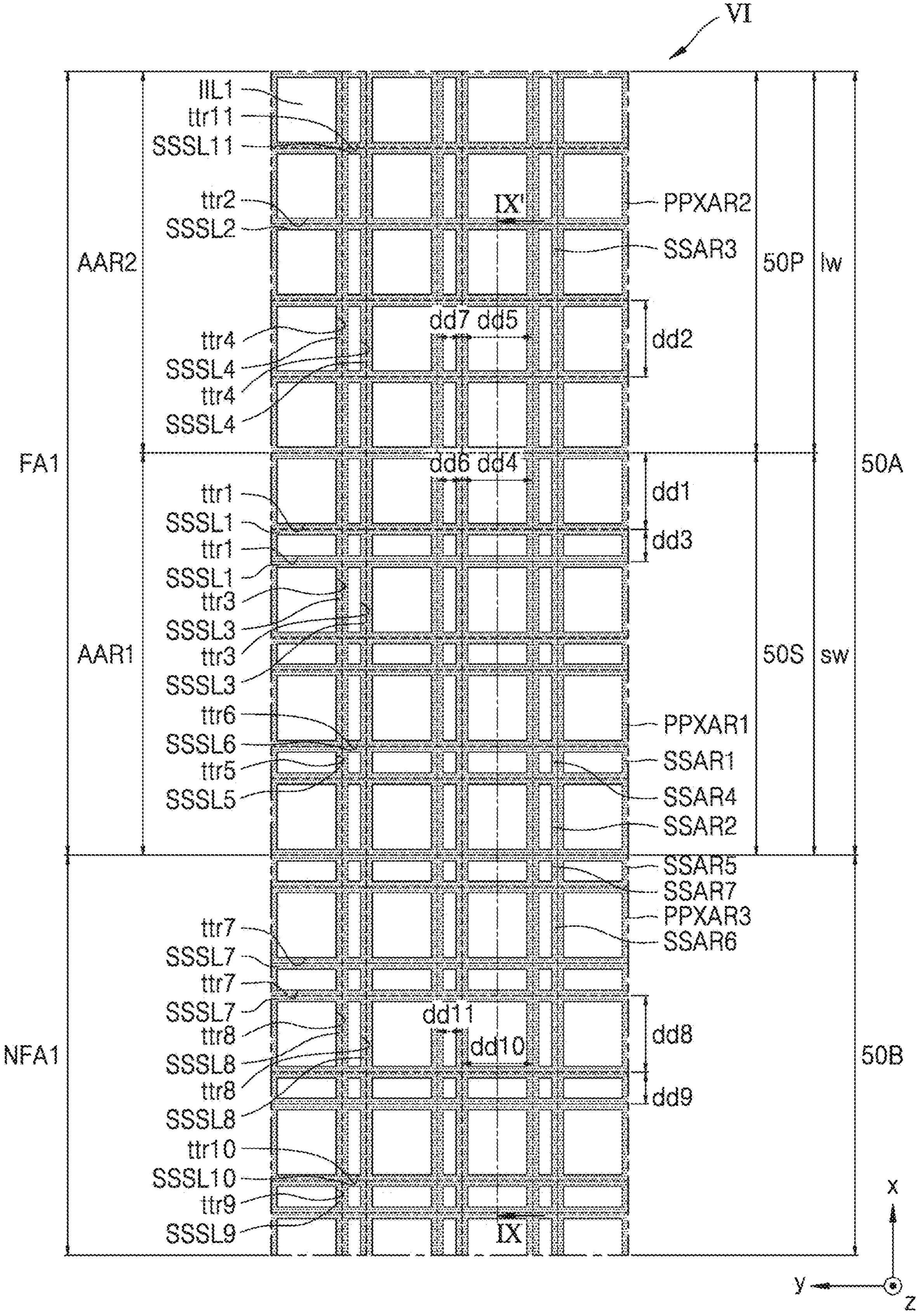
FIG. 18 is an enlarged plan view illustrating an example of region VI of FIG. 8 according to an embodiment.

FIG. 18 is an enlarged plan view illustrating an example of region VI of FIG. 8 according to an embodiment. FIG. 18 is a diagram illustrating the insulating layer and the separation layer in the folding area and the non-folding area, according to an embodiment. The first folding area FA1 and the first non-folding area NFA1 are mainly described with reference to FIG. 18, but the same description may also be applied to the second folding area FA2, the second non-folding area NFA2, and the third non-folding area NFA3. In FIG. 18, the same reference numerals as those in FIG. 17 denote the same members, and redundant descriptions thereof are omitted.

In an embodiment and referring to FIG. 18, the display panel 10 may include a first insulating layer IIL1 and first to tenth separation layers SSSL1, SSSL2, SSSL3, SSSL4, SSSL5, SSSL6, SSSL7, SSSL8, SSSL9, and SSSL10, respectively.

In an embodiment, the first insulating layer IIL1 may include first to tenth trenches ttr1, ttr2, ttr3, ttr4, ttr5, ttr6, ttr7, ttr8, ttr9, and ttr10, respectively.

In an embodiment, the first trenches ttr1 may respectively correspond to boundaries between the first pixel areas PPXAR1 and the first separation areas SSAR1 arranged in the first direction (e.g., ±x directions) and may be arranged in the first direction (e.g., x directions). The second trenches ttr2 may respectively correspond to boundaries between the second pixel areas PPXAR2 arranged in the first direction (e.g., ±x directions) and may be arranged in the first direction (e.g., ±x directions). The third trenches ttr3 may respectively correspond to boundaries between the first pixel areas PPXAR1 and the second separation areas SSAR2 arranged in the first direction (e.g., ±y directions) and may be arranged in the second direction (e.g., ±y directions). The fourth trenches ttr4 may respectively correspond to boundaries between the second pixel areas PPXAR2 and the third separation areas SSAR3 arranged in the second direction (e.g., ±y directions) and may be arranged in the second direction (e.g., ±y directions). The fifth trenches ttr5 may respectively correspond to boundaries between the first separation areas SSAR1 and the fourth separation areas SSAR4 and may be arranged in the second direction (e.g., ±y directions). The sixth trenches ttr6 may respectively correspond to boundaries between the second separation areas SSAR2 and the fourth separation areas SSAR4 and may be arranged in the first direction (e.g., ±x directions). The seventh trenches ttr7 may respectively correspond to boundaries between the third pixel areas PPXAR3 and the fifth separation areas SSAR5 arranged in the first direction (e.g., ±x directions) and may be arranged in the first direction (e.g., ±x directions). The eighth trenches ttr8 may respectively correspond to boundaries between the third pixel areas PPXAR3 and the sixth separation areas SSAR6 arranged in the second direction (e.g., ±y directions) and may be arranged in the second direction (e.g., ±y directions). The ninth trenches ttr9 may respectively correspond to boundaries between the fifth separation areas SSAR5 and the seventh separation areas SSAR7 and may be arranged in the second direction (e.g., ±y directions). The tenth trenches ttr10 may respectively correspond to boundaries between the sixth separation areas SSAR6 and the seventh separation areas SSAR7 and may be arranged in the first direction (e.g., ±x directions). The eleventh trenches ttr11 may respectively correspond to boundaries between the third pixel areas SSAR3 arranged in the first direction (e.g., ±x directions) and may be arranged in the first direction (e.g., ±x directions).

In an embodiment, the first trench ttr1, the third trench ttr3, the fifth trench ttr5, and the sixth trench ttr6 may be integral with each other. The second trench ttr2, the fourth trench ttr4, and the eleventh trench ttr11 may be integral with each other. The seventh trench ttr7, the eighth trench ttr8, the ninth trench ttr9, and the tenth trench ttr10 may be integral with each other.

In an embodiment, the first separation layers SSSL1 may be respectively buried in the first trenches ttr1. The second separation layers SSSL2 may be respectively buried in the second trenches ttr2. The third separation layers SSSL3 may be respectively buried in the third trenches ttr3. The fourth separation layers SSSL4 may be respectively buried in the fourth trenches ttr4. The fifth separation layers SSSL5 may be respectively buried in the fifth trenches ttr5. The sixth separation layers SSSL6 may be respectively buried in the sixth trenches ttr6. The seventh separation layers SSSL7 may be respectively buried in the seventh trenches ttr7. The eighth separation layers SSSL8 may be respectively buried in the eighth trenches ttr8. The ninth separation layers SSSL9 may be respectively buried in the ninth trenches ttr9. The tenth separation layers SSSL10 may be respectively buried in the tenth trenches ttr10. The eleventh separation layers SSSL11 may be respectively buried in the eleventh trenches ttr11.

In an embodiment, the first separation layers SSSL1, the third separation layers SSSL3, the fifth separation layers SSSL5, and the sixth separation layers SSSL6 may have a grid shape (or a mesh structure). The second separation layers SSSL2, the fourth separation layers SSSL4, the eleventh separation layers SSSL11 may have a grid shape (or a mesh structure). The seventh separation layers SSSL7, the eighth separation layers SSSL8, the ninth separation layers SSSL9, and the tenth separation layers SSSL10 may have a grid shape (or a mesh structure).

In an embodiment, the first separation layers SSSL1, the third separation layers SSSL3, the fifth separation layers SSSL5, and the sixth separation layers SSSL6 may be integral with each other. The second separation layers SSSL2, the fourth separation layers SSSL4, and the eleventh separation layers SSSL11 may be integral with each other. The seventh separation layers SSSL7, the eighth separation layers SSSL8, the ninth separation layers SSSL9, and the tenth separation layers SSSL10 may be integral with each other.

On the other hand, in an embodiment, FIG. 18 illustrates that the first pixel area PPXAR1 is completely surrounded by the first separation layers SSSL1 and the third separation layers SSSL3, but in another embodiment, the first pixel area PPXAR1 may be partially surrounded by the first separation layers SSSL1 and the third separation layers SSSL3. Although the first pixel area PPXAR1 has been mainly described, the same descriptions may also be applied to the second and third pixel areas PPXAR2 and PPXAR3, respectively, and the first to seventh separation areas SSAR1, SSAR2, SSAR3, SSAR4, SSAR5, SSAR6, and SSAR7, respectively. For example, FIG. 18 illustrates that the second pixel area PPXAR2 is completely surrounded by the second separation layers SSSL2 and the fourth separation layers SSSL4, but in another embodiment, the second pixel area PPXAR2 may be partially surrounded by the second separation layers SSSL2 and the fourth separation layers SSSL4.

In an embodiment, a first interval dd1 between some first separation layers SSSL1 adjacent to each other in the first direction (e.g., ±x directions) may be substantially equal to a second interval dd2 between the second separation layers SSSL2 adjacent to each other in the first direction (e.g., x directions). A third interval dd3 between other first separation layers SSSL1 adjacent to each other in the first direction (e.g., ±x directions) may be less than the first interval dd1. An eighth interval dd8 between some seventh separation layers SSSL7 adjacent to each other in the first direction (e.g., ±x directions) may be substantially equal to the first interval dd1. A ninth interval dd9 between other seventh separation layers SSSL7 adjacent to each other in the first direction (e.g., ±x directions) may be less than the eighth interval dd8. The ninth interval dd9 may be substantially equal to the third interval dd3.

In an embodiment, a fourth interval dd4 between some third separation layers SSSL3 adjacent to each other in the second direction (e.g., ±y directions) may be substantially equal to a fifth interval dd5 between some fourth separation layers SSSL4 adjacent to each other in the second direction (e.g., ±y directions). A sixth interval dd6 between other third separation layers SSSL3 adjacent to each other in the second direction (e.g., ±y directions) may be less than the fourth interval dd4. A seventh interval dd7 between other fourth separation layers SSSL4 adjacent to each other in the second direction (e.g., ±y directions) may be substantially equal to the sixth interval dd6. A tenth interval dd10 between some eighth separation layers SSSL8 adjacent to each other in the second direction (e.g., ±y directions) may be substantially equal to the fourth interval dd4. An eleventh interval dd11 between other eighth separation layers SSSL8 adjacent to each other in the second direction (e.g., ±y directions) may be substantially equal to the sixth interval dd6.

In an embodiment, the first to eleventh separation layers SSSL1, SSSL2, SSSL3, SSSL4, SSSL5, SSSL6, SSSL7, SSSL8, SSSL9, SSSL10, and SSSL11, respectively, may include a material that is different from a material of the first insulating layer IIL1. For example, the first insulating layer IIL1 may include an inorganic material, and the first to eleventh separation layers SSSL1, SSSL2, SSSL3, SSSL4, SSSL5, SSSL6, SSSL7, SSSL8, SSSL9, SSSL10, and SSSL11, respectively, may include an organic material. Because the first to eleventh separation layers SSSL1, SSSL2, SSSL3, SSSL4, SSSL5, SSSL6, SSSL7, SSSL8, SSSL9, SSSL10, and SSSL11, respectively, include an organic material, growth of cracks formed in the first insulating layer IIL1 including an inorganic material in a pixel into an adjacent pixel due to external impact may be more effectively prevented or minimized.

Figure 19:
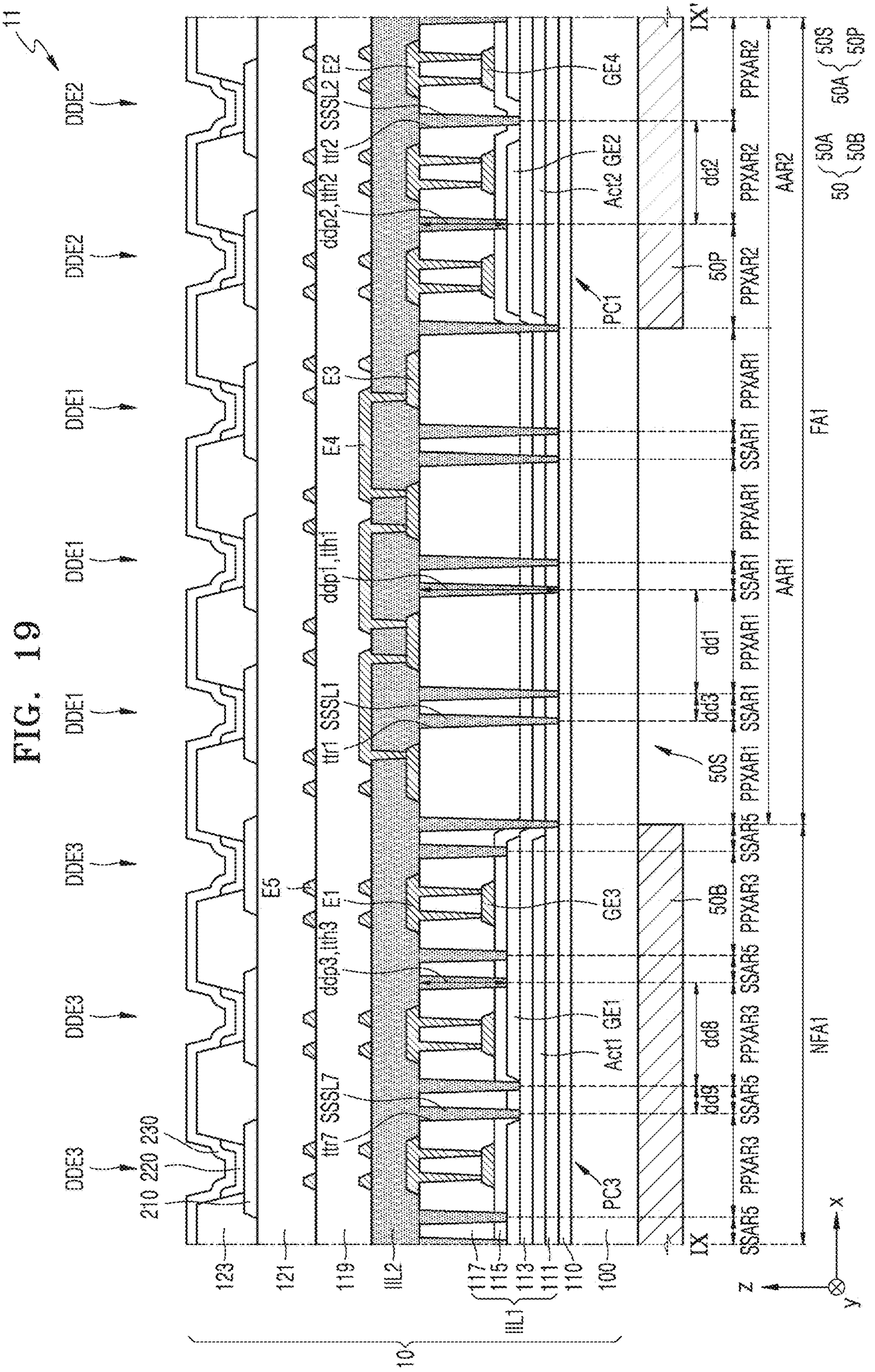
FIG. 19 is a cross-sectional view illustrating an example of a portion of the display apparatus of FIG. 18 taken along line IX-IX' according to an embodiment.

FIG. 19 is a cross-sectional view illustrating an example of a portion of the display apparatus 11 of FIG. 18 taken along line IX-IX' according to an embodiment. The first folding area FA1 and the first non-folding area NFA1 are mainly described with reference to FIG. 19, but the same description may also be applied to the second folding area FA2, the second non-folding area NFA2, and the third non-folding area NFA3.

In an embodiment and referring to FIG. 19, the display apparatus 11 may include a display panel 10 and a support layer 50. The display panel 10 may include the first folding area FA1 corresponding to the first support portion 50A of the support layer 50, and the first non-folding area NFA1 corresponding to the second support portion 50B of the support layer 50. The first folding area FA1 may include a first area AAR1 corresponding to the slit 50S of the first support portion 50A of the support layer 50, and a second area AAR2 corresponding to the rib 50P of the first support portion 50A of the support layer 50.

In an embodiment, the first area AAR1 of the first folding area FA1 may include first pixel areas PPXAR1 and first separation areas SSAR1, the second area AAR2 of the first folding area FA1 may include second pixel areas PPXAR2, and the first non-folding area NFA1 may include third pixel areas PPXAR3 and fifth separation areas SSAR5. As described above with reference to FIG. 17, first pixel circuits PC1 or second pixel circuits PC2 may be in the second pixel areas PPXAR2, respectively. Third pixel circuits PC3 may be in the third pixel areas PPXAR3, respectively. First display elements DDE1 electrically connected to the first pixel circuits PC1 may be in the first area AAR1 of the first folding area FA1, respectively. Second display elements DDE2 electrically connected to the second pixel circuits PC2 may be in the second area AAR2 of the first folding area FA1, respectively. Third display elements DDE3 electrically connected to the third pixel circuits PC3 may be in the first non-folding area NFA1, respectively.

On the other hand, in an embodiment, no pixel circuits may be in the first pixel areas PPXAR1, and signal lines connected to the pixel circuits may be in the first pixel areas PPXAR1. For example, third electrodes E3 may be in the first pixel areas PPXAR1, respectively. The third electrodes E3 may be connected through fourth electrodes E4. The third and fourth electrodes E3 and E4, respectively, may correspond to the first scan line SL1, the second scan line SL2, the third scan line SL3, the emission control line EL, the data line DL, the driving voltage line PL, and the initialization voltage line VIL of FIG. 15.

In an embodiment, the first to third pixel circuits PC1, PC2, and PC3, respectively, may each include a semiconductor layer, a gate electrode, an electrode, and the like. For example, the first pixel circuit PC1 may include a second semiconductor layer Act2, a second gate electrode GE2, a fourth gate electrode GE4, and a second electrode E2, and the third pixel circuit PC3 may include a first semiconductor layer Act1, a first gate electrode GE1, a third gate electrode GE3, and a first electrode E1. Although the first pixel circuit PC1 and the third pixel circuit PC3 have been mainly described, the same description may also be applied to the second pixel circuit PC2.

In an embodiment, the pixel circuits adjacent to each other may share a gate electrode with each other. For example, the first pixel circuits PC1 disposed adjacent to each other may share the second gate electrode GE2 with each other, and the third pixel circuits PC3 adjacent to each other may share the first gate electrode GE1 with each other. Although the first pixel circuit PC1 and the third pixel circuit PC3 have been mainly described, the same description may also be applied to the second pixel circuit PC2.

In an embodiment, the display panel 10 may include a first insulating layer II11. The first insulating layer IIL1 may include a buffer layer 111, a first gate insulating layer 113, a second gate insulating layer 115, and an interlayer insulating layer 117. The first insulating layer IIL1 may have first trenches ttr1 respectively corresponding to boundaries between the first pixel areas PPXAR1 and the first separation areas SSAR1 arranged in the first direction (e.g., ±x directions), second trenches ttr2 respectively corresponding to boundaries between the second pixel areas PPXAR2 arranged in the first direction (e.g., ±x directions), and seventh trenches ttr7 respectively corresponding to boundaries between the third pixel areas PPXAR3 and the fifth separation areas SSAR5 arranged in the first direction (e.g., ±x directions).

In an embodiment, a first depth ddp1 of the first trench ttr1 in the thickness direction (e.g., z directions) of the substrate 100 may be different from a second depth ddp2 of the second trench ttr2 in the thickness direction (e.g., ±z directions) of the substrate 100. For example, the first depth ddp1 may be greater than the second depth ddp2. The first depth ddp1 of the first trench ttr1 in the thickness direction (e.g., ±z directions) of the substrate 100 may be different from a third depth ddp3 of the seventh trench ttr7 in the thickness direction (e.g., ±z directions) of the substrate 100. For example, the first depth ddp1 may be greater than the third depth ddp3. The second depth ddp2 of the second trench ttr2 in the thickness direction (e.g., ±z directions) of the substrate 100 may be substantially equal to the third depth ddp3 of the seventh trench ttr7 in the thickness direction (e.g., z directions) of the substrate 100.

In an embodiment, the first trench ttr1 may be formed in the buffer layer 111, the first gate insulating layer 113, the second gate insulating layer 115, and the interlayer insulating layer 117, and the second trench ttr2 and the seventh trench ttr7 may be formed in the second gate insulating layer 115 and the interlayer insulating layer 117.

In an embodiment, the first separation layer SSSL1, the second separation layer SSSL2, and the seventh separation layer SSSL7 may be in the first trench ttr1, the second trench ttr2, and the seventh trench ttr7, respectively. In other words, the first separation layer SSSL1, the second separation layer SSSL2, and the seventh separation layer SSSL7 may be buried in the first trench ttr1, the second trench ttr2, and the seventh trench ttr7, respectively. Because the first separation layer SSSL1, the second separation layer SSSL2, and the seventh separation layer SSSL7 are buried in the first trench ttr1, the second trench ttr2, and the seventh trench ttr7, respectively, a height difference (e.g., step)) in the first insulating layer IIL1 due to the first trench ttr1, the second trench ttr2, and the seventh trench ttr7 may be removed or minimized.

In an embodiment, a first interval dd1 between some first separation layers SSSL1 adjacent to each other in the first direction (e.g., ±x directions) may be substantially equal to a second interval dd2 between the second separation layers SSSL2 adjacent to each other in the first direction (e.g., x directions). A third interval dd3 between other first separation layers SSSL1 adjacent to each other in the first direction (e.g., ±x directions) may be less than the first interval dd1. An eighth interval dd8 between some seventh separation layers SSSL7 adjacent to each other in the first direction (e.g., ±x directions) may be substantially equal to the first interval dd1. A ninth interval dd9 between other seventh separation layers SSSL7 adjacent to each other in the first direction (e.g., ±x directions) may be less than the eighth interval dd8. The ninth interval dd9 may be substantially equal to the third interval dd3.

In an embodiment, a first thickness tth1 of the first separation layer SSSL1 in the thickness direction (e.g., ±z directions) of the substrate 100 may be different from a second thickness tth2 of the second separation layer SSSL2 in the thickness direction (e.g., z directions) of the substrate 100. For example, the first thickness tth1 may be greater than the second thickness tth2. The first thickness tth1 of the first separation layer SSSL1 in the thickness direction (e.g., ±z directions) of the substrate 100 may be different from a third thickness tth3 of the third separation layer SSSL3 in the thickness direction (e.g., z directions) of the substrate 100. For example, the first thickness tth1 may be greater than the third thickness tth3. The second thickness tth2 of the second separation layer SSSL2 in the thickness direction (e.g., ±z directions) of the substrate 100 may be substantially equal to the third thickness tth3 of the third separation layer SSSL3 in the thickness direction (e.g., z directions) of the substrate 100.

Hereinafter, the elements included in the display apparatus 11 are described in more detail according to the stack structure with reference to FIG. 19 according to an embodiment.

A support layer 50 may include at least one of glass, plastic, and/or metal. In an embodiment, the support layer 50 may include polyurethane and/or carbon fiber reinforced plastic. In an embodiment, the support layer 50 may include at least one of stainless steel, invar, nickel (Ni), cobalt (Co), a nickel alloy, and/or a nickel-cobalt alloy. In an embodiment, the support layer 50 may include austenitic stainless steels.

In an embodiment, a substrate 100 on the support layer 50 may include glass and/or polymer resin. The polymer resin may include polyethersulfone, polyacrylate, polyetherimide, polyethylene naphthalate, polyethylene terephthalate, polyphenylene sulfide, polyarylate, polyimide, polycarbonate, and/or cellulose acetate propionate. The substrate 100 including the polymer resin may be flexible, rollable, and/or bendable. The substrate 100 may have a multilayer structure including an inorganic layer (not illustrated) and/or a layer including the polymer resin described above.

In an embodiment, a barrier layer 110 may be disposed on the substrate 100. The barrier layer 110 may prevent or minimize infiltration of impurities from the substrate 100 or the like into first and second semiconductor layers Act1 and Act2. The barrier layer 110 may include an inorganic material, such as an oxide or a nitride, an organic material, and/or an organic/inorganic composite material, and may have a single-layer or multilayer structure including an inorganic material and an organic material.

In an embodiment, a first insulating layer IIL1 may be disposed on the barrier layer 110. The first insulating layer IIL1 may include silicon oxide ($SiO_X$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_X$).

In an embodiment, a first separation layer SSSL1, a second separation layer SSSL2, and a seventh separation layer SSSL7 respectively arranged in a first trench ttr1, a second trench ttr2, and a seventh trench ttr7 of the first insulating layer IIL1 may include a single layer or layers including an organic material. For example, the first separation layer SSSL1, the second separation layer SSSL2, and/or the seventh separation layer SSSL7 may each include general-purpose polymer (e.g., BCB, polyimide, HMDSO, PMMA, or PS), polymer derivatives having a phenolic group, acrylic polymer, imide-based polymer, aryl ether-based polymer, amide-based polymer, fluorine-based polymer, p-xylene-based polymer, vinyl alcohol-based polymer, and/or any blend thereof.

In an embodiment, the first and second semiconductor layers Act1 and Act2 may be disposed on the buffer layer 111. The first and second semiconductor layers Act1 and Act2 may each include amorphous silicon and/or polysilicon. In another embodiment, the first and second semiconductor layers Act1 and Act2 may each include an oxide of at least one selected from indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and/or zinc (Zn).

In an embodiment, the first and second semiconductor layers Act1 and Act2 may each include a channel region, and a source region and a drain region respectively on both sides of the channel region. The first and second semiconductor layers Act1 and Act2 may each include a single layer or layers.

In an embodiment, a first gate insulating layer 113 may be disposed on the buffer layer 111 and cover the first and second semiconductor layers Act1 and Act2. First and second gate electrodes GE1 and GE2, respectively, may be disposed on the first gate insulating layer 113. The first and second gate electrodes GE1 and GE2, respectively, may each include a conductive material including molybdenum (Mo), aluminum (Al), copper (Cu), titanium (Ti), and/or the like, and may each include a single layer or layers including the conductive material described above. For example, the first and second gate electrodes GE1 and GE2, respectively, may each be a single Mo layer.

In an embodiment, a second gate insulating layer 115 may be disposed on the first gate insulating layer 113 and cover the first and second gate electrodes GE1 and GE2, respectively. Third and fourth gate electrodes GE3 and GE4, respectively, may be disposed on the second gate insulating layer 115. The third and fourth gate electrodes GE3 and GE4, respectively, may each include a conductive material including molybdenum (Mo), aluminum (Al), copper (Cu), titanium (Ti), and/or the like, and may each include a single layer or layers including the conductive material described above. For example, the third and fourth gate electrodes GE3 and GE4, respectively, may each be a single Mo layer.

In an embodiment, an interlayer insulating layer 117 may be disposed on the second gate insulating layer 115 and cover the third and fourth gate electrodes GE3 and GE4, respectively. First to third electrodes E1, E2, and E3, respectively, may be disposed on the interlayer insulating layer 117. The first and second electrodes E1 and E2, respectively, may be connected to the gate electrode through at least one contact hole formed in the interlayer insulating layer 117. The first to third electrodes E1, E2, and E3, respectively, may each include a conductive material including molybdenum (Mo), aluminum (Al), copper (Cu), titanium (Ti), and/or the like, and may each include a single layer or layers including the conductive material described above. For example, the first to third electrodes E1, E2, and E3, respectively, may each have a multilayer structure of Ti/Al/Ti.

In an embodiment, a second insulating layer IIL2 may be disposed on the interlayer insulating layer 117 and cover the first to third electrodes E1, E2, and E3, respectively. The second insulating layer IIL2 may include a single layer or layers including an organic material and may provide a flat upper surface. The second insulating layer IIL2 may include general-purpose polymer (e.g., BCB, polyimide, HMDSO, PMMA, or PS), polymer derivatives having a phenolic group, acrylic polymer, imide-based polymer, aryl ether-based polymer, amide-based polymer, fluorine-based polymer, p-xylene-based polymer, vinyl alcohol-based polymer, and/or any blend thereof.

In an embodiment, the first separation layer SSSL1, the second separation layer SSSL2, the seventh separation layer SSSL7, and the second insulating layer IIL2 may be integral with each other.

In an embodiment, a fourth electrode E4 may be on the second insulating layer IIL2. A portion of the fourth electrode E4 may be connected to the third electrode E3 through a contact hole formed in the second insulating layer IIL2. The fourth electrode E4 may include a conductive material including molybdenum (Mo), aluminum (Al), copper (Cu), titanium (Ti), and/or the like, and may include a single layer or layers including the conductive material described above. For example, the fourth electrode E4 may have a multilayer structure of Ti/Al/Ti.

In an embodiment, a third insulating layer 119 may be disposed on the second insulating IIL2 and cover the fourth electrode E4. The third insulating layer 119 may include a single layer or layers including an organic material and may provide a flat upper surface. The third insulating layer 119 may include general-purpose polymer (e.g., BCB, polyimide, HMDSO, PMMA, or PS), polymer derivatives having a phenolic group, acrylic polymer, imide-based polymer, aryl ether-based polymer, amide-based polymer, fluorine-based polymer, p-xylene-based polymer, vinyl alcohol-based polymer, and/or any blend thereof.

In an embodiment, a fifth electrode E5 may be on the third insulating layer 119. Although not illustrated in FIG. 19, the fifth electrode E5 may be connected to the fourth electrode E4 through at least one contact hole formed in the third insulating layer 119. The fifth electrode E5 may include a conductive material including molybdenum (Mo), aluminum (Al), copper (Cu), titanium (Ti), and/or the like, and may include a single layer or layers including the conductive material described above. For example, the fifth electrode E5 may have a multilayer structure of Ti/Al/Ti.

In an embodiment, a fourth insulating layer 121 may be disposed on the third insulating layer 119 and cover the fifth electrode E5. The fourth insulating layer 121 may include a single layer or layers including an organic material and may provide a flat upper surface. The fourth insulating layer 121 may include general-purpose polymer (e.g., BCB, polyimide, HMDSO, PMMA, or PS), polymer derivatives having a phenolic group, acrylic polymer, imide-based polymer, aryl ether-based polymer, amide-based polymer, fluorine-based polymer, p-xylene-based polymer, vinyl alcohol-based polymer, and/or any blend thereof.

In an embodiment, first to third display elements DDE1, DDE2, and DDE3, respectively, may be disposed on the fourth insulating layer 121. The first to third display elements DDE1, DDE2, and DDE3, respectively, may each be an OLED. The first to third display elements DDE1, DDE2, and DDE3, respectively, may each include a pixel electrode 210, an intermediate layer 220 including an organic emission layer, and an opposite electrode 230. Although not illustrated in FIG. 19, the first to third display elements DDE1, DDE2, and DDE3, respectively, may be connected to the fifth electrode E5 through at least one contact hole formed in the fourth insulating layer 121.

In an embodiment, the pixel electrode 210 may be a (semi)transmissive electrode or a reflective electrode. In some embodiments, the pixel electrode 210 may include a reflective layer and a transparent or semitransparent electrode layer disposed on the reflective layer. The reflective layer may include Ag, Mg, Al, Pt, Pd, Au, Ni, Nd, Ir, Cr, and/or any compound thereof. The transparent or semitransparent electrode layer may include at least one selected from indium tin oxide (ITO), indium zinc oxide (IZO), zinc oxide (ZnO), indium oxide ($In_2O_3$), indium gallium oxide (IGO), and/or aluminum zinc oxide (AZO). In some embodiments, the pixel electrode 210 may have a stack structure of ITO/Ag/ITO.

In an embodiment, in the display area of the substrate 100, a pixel defining layer 123 may be disposed on the fourth insulating layer 121. The pixel defining layer 123 may cover an edge of the pixel electrode 210 and may have an opening exposing a central portion of the pixel electrode 210. The opening may define an emission area of each of the first to third display elements DDE1, DDE2, and DDE3, respectively.

In an embodiment, the pixel defining layer 123 may prevent an electric arc or the like from occurring on the edge of the pixel electrode 210 by increasing the distance between the edge of the pixel electrode 210 and the opposite electrode 230 on the pixel electrode 210.

In an embodiment, the pixel defining layer 123 may include at least one organic insulating material selected from polyimide, polyamide, acrylic resin, BCB, and phenol resin, and may be formed by spin coating. The pixel defining layer 123 may include an organic insulating material. Alternatively, the pixel defining layer 123 may include an inorganic insulating material, such as silicon nitride, silicon oxynitride, and/or silicon oxide. Alternatively, the pixel defining layer 123 may include an organic insulating material and an inorganic insulating material. In some embodiments, the pixel defining layer 123 may include a light blocking material and may be provided in black. The light blocking material may include carbon black, carbon nanotubes, a resin or paste including black dye, metal particles (e.g., nickel, aluminum, molybdenum, and any alloy thereof), metal oxide particles (e.g., chromium oxide), and/or metal nitride particles (e.g., chromium nitride). When the pixel defining layer 123 includes a light blocking material, the reflection of external light due to the metal structures below the pixel defining layer 123 may be reduced.

In an embodiment, the intermediate layer 220 may be in the opening formed by the pixel defining layer 123 and may include an organic emission layer. The organic emission layer may include an organic material including a fluorescent and/or phosphorescent material that emits red light, green light, blue light, or white light. The organic emission layer may include a low molecular weight organic material and/or a high molecular weight organic material. Functional layers, such as a hole transport layer (HTL), a hole injection layer (HIL), an electron transport layer (ETL), and/or an electron injection layer (EIL), may be further optionally disposed below and/or above the organic emission layer.

In an embodiment, the opposite electrode 230 may be a transmissive electrode or a reflective electrode. In some embodiments, the opposite electrode 230 may be a transparent or semitransparent electrode and may include a metal thin-film having a low work function and including Li, Ca, LiF/Ca, LiF/Al, Al, Ag, Mg, and/or any compound thereof. In addition, a transparent conductive oxide (TCO) layer, such as ITO, IZO, ZnO, or $In_2O_3$, may be further disposed on the metal thin-film. The opposite electrode 230 may be disposed over the display area and may be disposed above the intermediate layer 220 and the pixel defining layer 123. The opposite electrodes 230 may be integral with each other in the first to third display elements DDE1, DDE2, and DDE3, respectively, to correspond to the pixel electrodes 210.

In an embodiment, because the display elements 200 may be easily damaged by external moisture or oxygen, an encapsulation layer (not shown) may cover the display elements 200 in order to protect the display elements 200. The encapsulation layer may cover the display area and may extend to at least a portion of the peripheral area. The encapsulation layer may include a first inorganic encapsulation layer, an organic encapsulation layer, and a second inorganic encapsulation layer.

Figure 20:
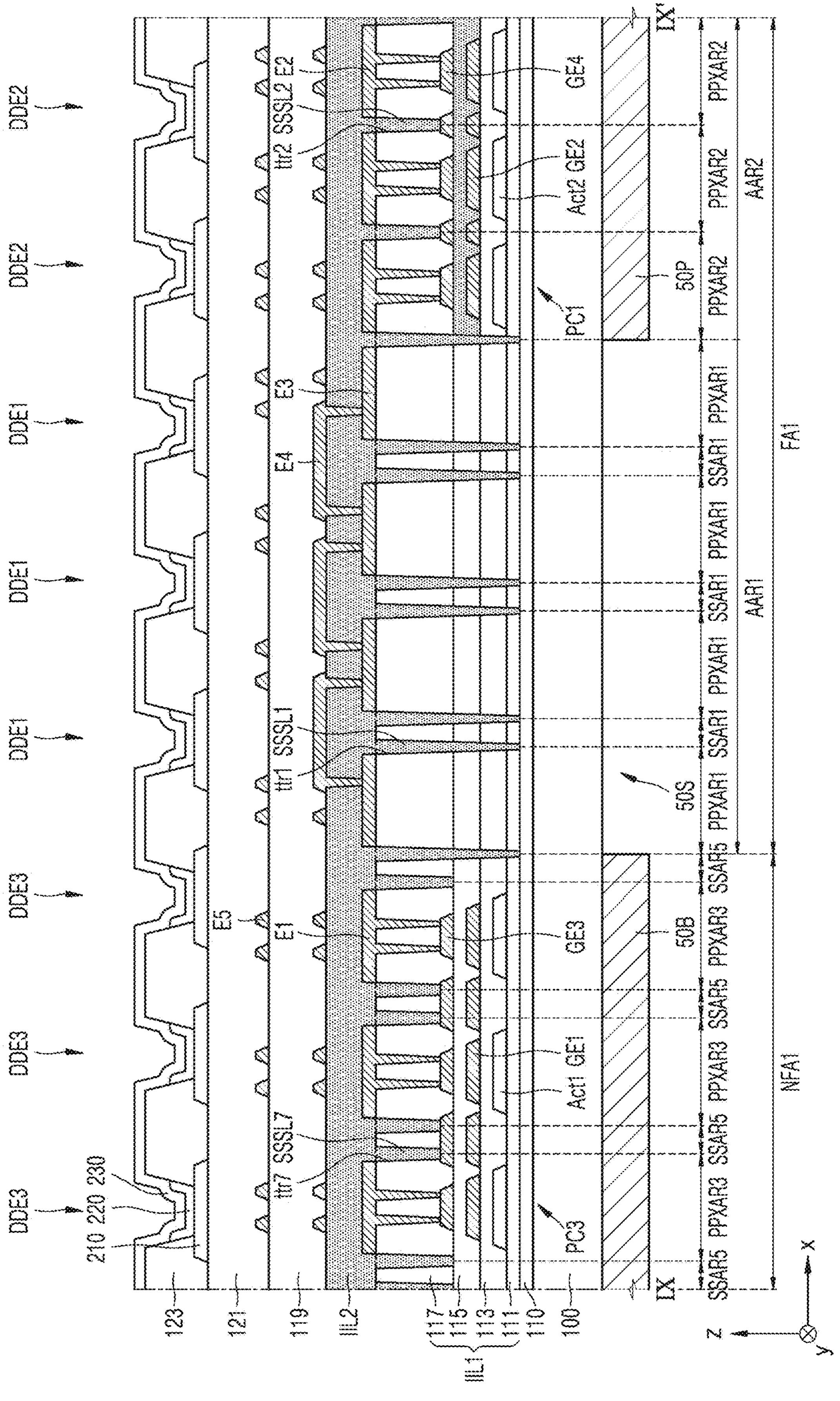
FIG. 20 is a cross-sectional view illustrating an example of a portion of the display apparatus of FIG. 18 taken along line IX-IX' according to an embodiment.

FIG. 20 is a cross-sectional view illustrating an example of a portion of the display apparatus of FIG. 18 taken along line IX-IX' according to an embodiment. FIG. 20 is a modification of FIG. 19 and differs from FIG. 19 in view of a structure of a trench. Hereinafter, the same description as provided above with reference to FIG. 19 is equally applied to the description of FIG. 20 and the differences from FIG. 19 are mainly described.

In an embodiment, referring to FIG. 20, unlike FIG. 19, second and seventh trenches ttr2 and ttr7 may be formed in an interlayer insulating layer 117. First pixel circuits PC1 adjacent to each other may share a fourth gate electrode GE4 with each other, and third pixel circuits PC3 adjacent to each other may share a third gate electrode GE3 with each other. Although the first pixel circuit PC1 and the third pixel circuit PC3 have been mainly described, the same description may also be applied to a second pixel circuit PC2.

In an embodiment, as illustrated in FIG. 20, sidewalls of a first insulating layer IIL1 defining a first trench ttr1, a second trench ttr2, and a seventh trench ttr7 may substantially coincide with edges of a third electrode E3.

Figure 21:
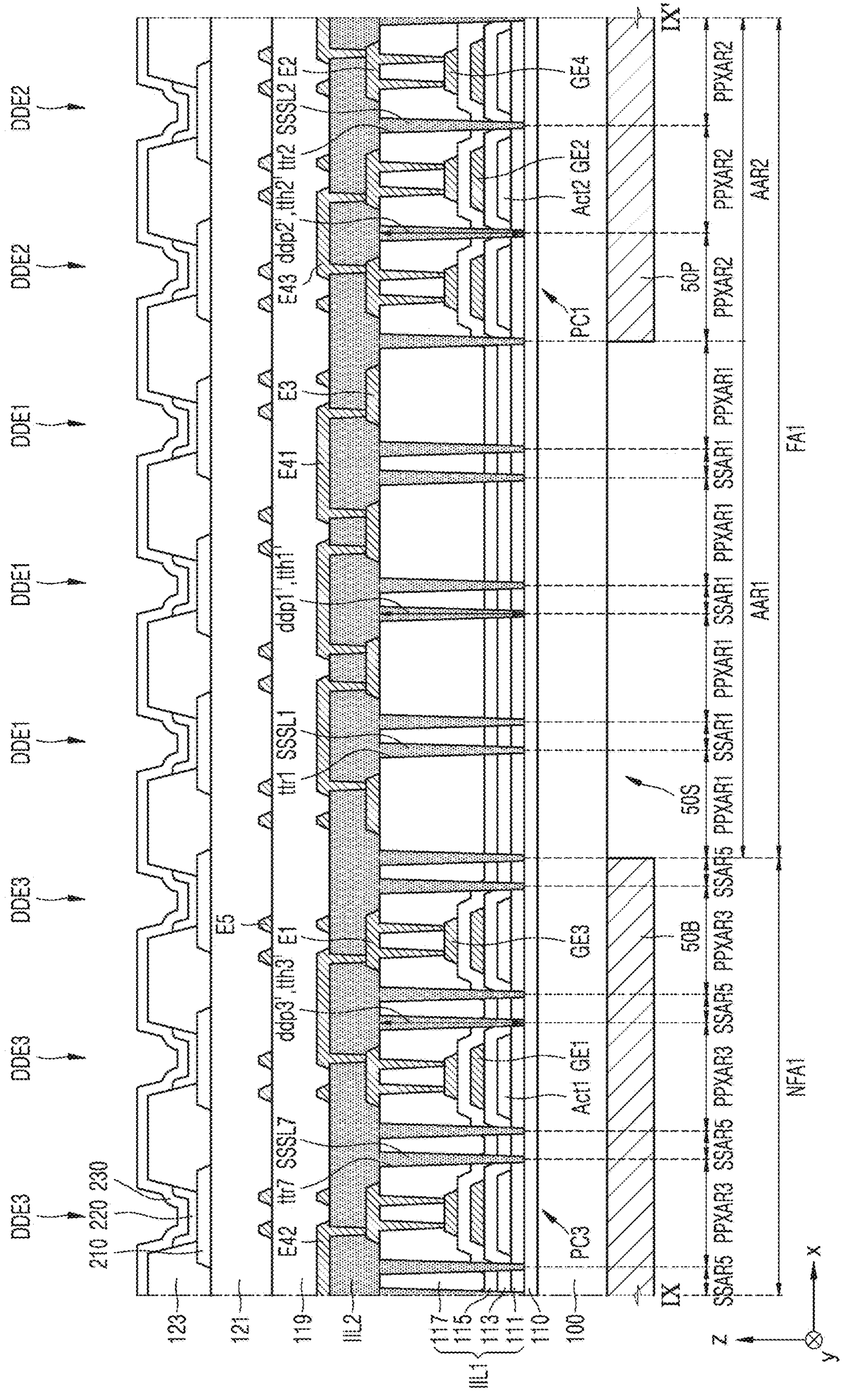
FIG. 21 is a cross-sectional view illustrating an example of a portion of the display apparatus of FIG. 18 taken along line IX-IX' according to an embodiment.

FIG. 21 is a cross-sectional view illustrating an example of a portion of the display apparatus of FIG. 18 taken along line IX-IX' according to an embodiment. FIG. 21 is a modification of FIG. 19 and differs from FIG. 19 in view of a structure of a trench. Hereinafter, the same description as provided above with reference to FIG. 19 is equally applied to the description of FIG. 20 and the differences from FIG. 19 are mainly described.

In an embodiment and referring to FIG. 21, unlike FIG. 19, depths of a first trench ttr1, a second trench ttr2, and a seventh trench ttr7 in the thickness direction (e.g., ±z directions) of a substrate 100 may be substantially equal to each other. A first depth ddp1' of the first trench ttr1, a second depth ddp2' of the second trench ttr2, and a third depth ddp3' of the seventh trench ttr7 may be substantially equal to each other. The first trench ttr1, the second trench ttr2, and the seventh trench ttr7 may be formed in a buffer layer 111, a first gate insulating layer 113, a second gate insulating layer 115, and an interlayer insulating layer 117.

Also, in an embodiment, thicknesses of a first separation layer SSSL1, a second separation layer SSSL2, and a seventh separation layer SSSL7 in the thickness direction (e.g., z directions) of the substrate 100 may be substantially equal to each other. A first thickness tth1' of the first separation layer SSSL1, a second thickness tth2' of the second separation layer SSSL2, and a third thickness tth3' of the seventh separation layer SSSL7 may be substantially equal to each other.

In an embodiment, a fourth-first electrode E41 on a second insulating layer IIL2 may connect adjacent third electrodes E3 to each other, a fourth-second electrode E42 may connect adjacent first electrodes E1 to each other, a fourth-third electrode E43 may connect adjacent second electrodes E2 to each other.

Figure 22:
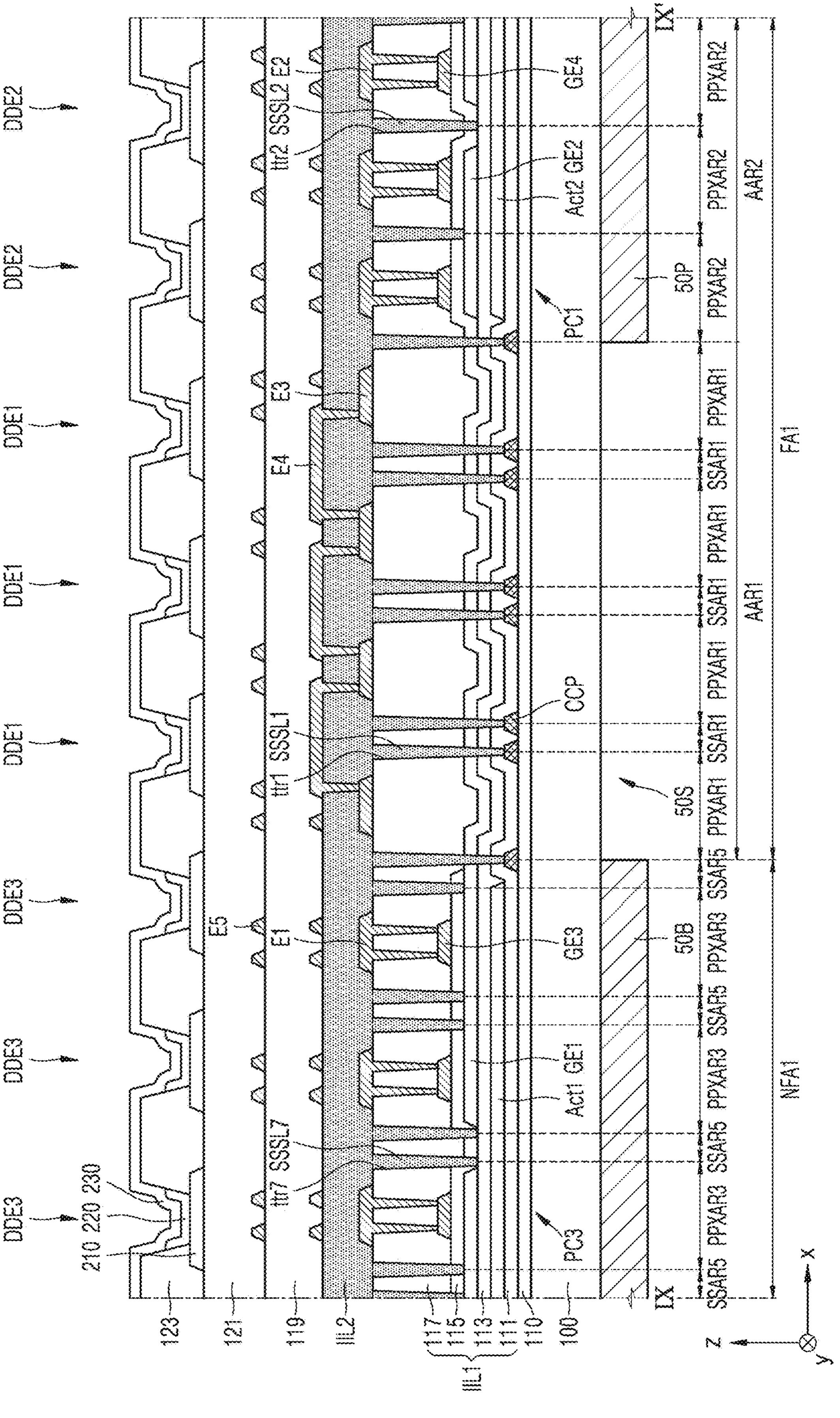
FIG. 22 is a cross-sectional view illustrating an example of a portion of the display apparatus of FIG. 18 taken along line IX-IX' according to an embodiment.

FIG. 22 is a cross-sectional view illustrating an example of a portion of the display apparatus of FIG. 18 taken along line IX-IX' according to an embodiment. FIG. 22 is a modification of FIG. 19 and differs from FIG. 3 in view of a structure of a conductive pattern. Hereinafter, the same description as provided above with reference to FIG. 19 is equally applied to the description of FIG. 22 and the differences from FIG. 19 are mainly described.

In an embodiment, referring to FIG. 22, a display panel 10 may include conductive patterns CCP. The conductive patterns CCP may be between a substrate 100 and first separation layers SSSL1 and may be in contact with the first separation layers SSSL1, respectively. The conductive patterns CCP may each include a conductive material including molybdenum (Mo), aluminum (Al), copper (Cu), titanium (Ti), and/or the like, and may include a single layer or layers including the conductive material described above. For example, the conductive patterns CCP may each be a single Mo layer.

In an embodiment, when a first insulating layer IIL1 is etched in order to form first trenches ttr1, the conductive patterns CCP may assist in making the etched depth uniform. Due to the conductive patterns CCP between the substrate 100 and the first separation layers SSSL1, the first trenches ttr1 having the uniform depth may be formed in the first insulating layer IIL1.

On the other hand, in an embodiment, although not illustrated in FIG. 22, a moisture barrier layer may be disposed below the conductive pattern CCP. The moisture barrier layer may include an inorganic material. For example, the moisture barrier layer may include silicon oxide ($SiO_X$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_X$).

Figure 23:
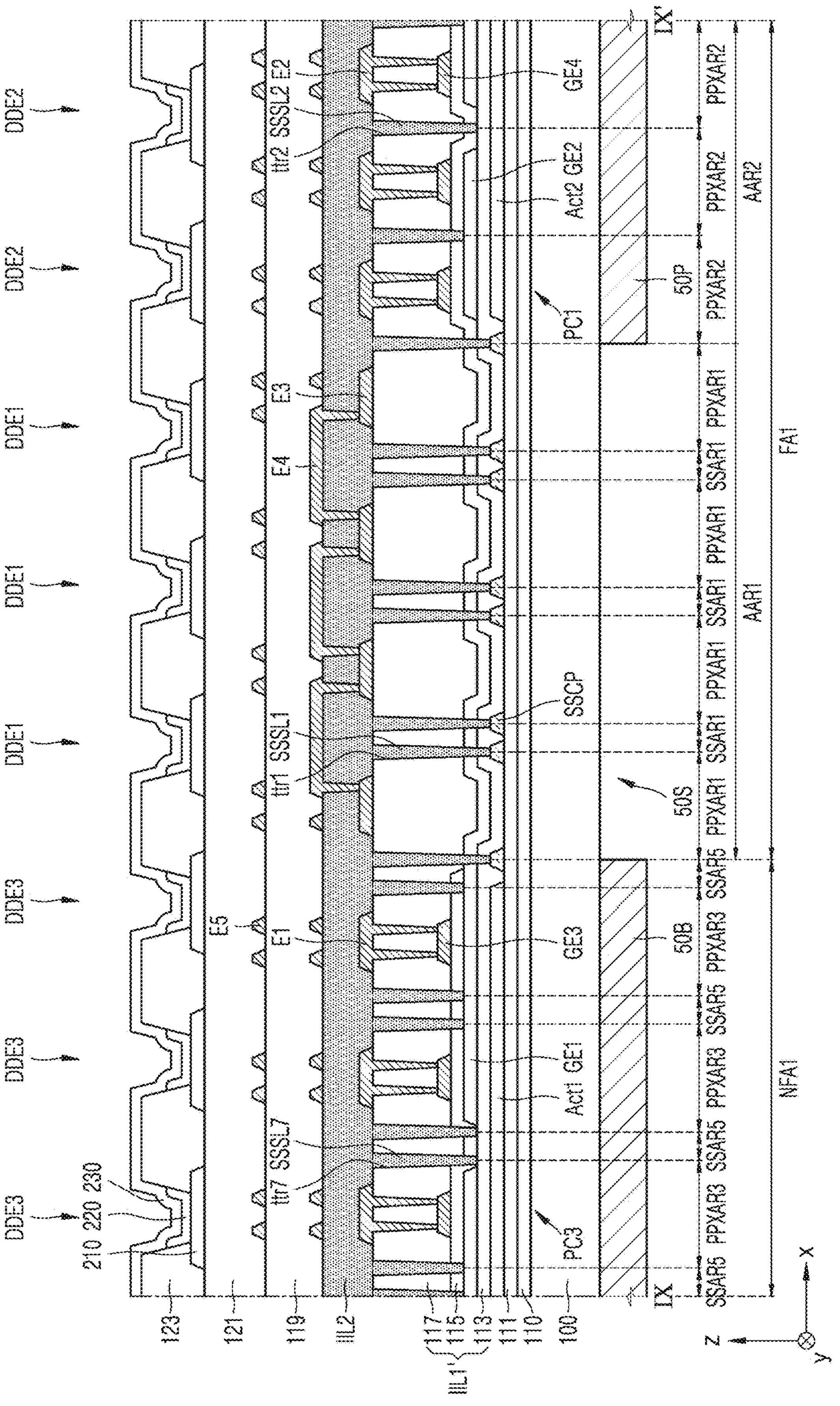
FIG. 23 is a cross-sectional view illustrating an example of a portion of the display apparatus of FIG. 18 taken along line IX-IX' according to an embodiment.

FIG. 23 is a cross-sectional view illustrating an example of a portion of the display apparatus of FIG. 18 taken along line IX-IX' according to an embodiment. FIG. 23 is a modification of FIG. 19 and differs from FIG. 19 in view of a structure of a conductive pattern. Hereinafter, the same description as provided above with reference to FIG. 19 is equally applied to the description of FIG. 23 and the differences from FIG. 19 are mainly described.

In an embodiment, referring to FIG. 23, unlike FIG. 19, a first insulating layer IIL1' may include a first gate insulating layer 113, a second gate insulating layer 115, and an interlayer insulating layer 117. A first trench ttr1 may be formed in the first gate insulating layer 113, the second gate insulating layer 115, and the interlayer insulating layer 117.

In an embodiment, the display panel 10 may include semiconductor patterns SSCP. The semiconductor patterns SSCP may be between a substrate 100 and first separation layers SSSL1 and may be in contact with the first separation layers SSSL1, respectively. The semiconductor patterns SSCP may each include amorphous silicon and/or polysilicon. In another embodiment, the semiconductor patterns SSCP may each include an oxide of at least one selected from indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

In an embodiment, when a first insulating layer IIL1' is etched in order to form first trenches ttr1, the semiconductor patterns SSCP may assist in making the etched depth uniform. Due to the semiconductor patterns SSCP between the substrate 100 and the first separation layers SSSL1, the first trenches ttr1 having the uniform depth may be formed in the first insulating layer IIL1'.

On the other hand, in an embodiment, although not illustrated in FIG. 23, a moisture barrier layer may be disposed below the semiconductor pattern SSCP. The moisture barrier layer may include an inorganic material. For example, the moisture barrier layer may include silicon oxide ($SiO_X$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_X$).

The display apparatus has been mainly described above, but the disclosure is not limited thereto. For example, it may be stated that a method of manufacturing the display apparatus also falls within the scope of the disclosure.

According to one or more embodiments, a high-resolution display apparatus that is flexible and robust against external impact may be implemented. The scope of the disclosure is not limited by such an effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims. The embodiments of the present disclosure disclosed in the present disclosure and illustrated in the drawings are provided as particular examples for more easily explaining the technical contents according to the present disclosure and helping understand the embodiments of the present disclosure, but not intended to limit the scope of the embodiments of the present disclosure. Accordingly, the scope of the various embodiments of the present disclosure should be interpreted to include, in addition to the embodiments disclosed herein, all alterations or modifications derived from the technical ideas of the various embodiments of the present disclosure. Moreover, the embodiments or parts of the embodiments may be combined in whole or in part without departing from the scope of the invention.

What is claimed is:

1. A display apparatus comprising:

a substrate defining a first area and a second area, the first area comprising a plurality of first pixel areas arranged in a first direction and a second direction and a plurality of first separation areas disposed between first pixel areas of the plurality of first pixel areas disposed adjacent to each other in the first direction, and the second area comprising a plurality of second pixel areas arranged in the first direction and the second direction;

a first insulating layer disposed on the substrate and having a plurality of first trenches and a plurality of second trenches, the plurality of first trenches being arranged in the first direction and corresponding to boundaries between first pixel areas of the plurality of first pixel areas arranged in the first direction and the plurality of first separation areas, the plurality of second trenches being arranged in the first direction and corresponding to boundaries between second pixel areas of the plurality of second pixel areas arranged in the first direction;

a plurality of first separation layers buried in the plurality of first trenches and including a material that is different from a material of the first insulating layer; and a plurality of second separation layers buried in the plurality of second trenches and including a material that is different from the material of the first insulating layer, wherein a number of differently shaped and differently sized interval gaps delimited by the plurality of first pixel areas arranged in the first and second directions in the first area exceeds a number of differently shaped and differently sized interval gaps delimited by the plurality of the second pixel areas arranged in the first and second directions in the second area.

2. The display apparatus of claim 1, wherein a first length of each of the plurality of first pixel areas in the first direction is substantially equal to a second length of each of the plurality of second pixel areas in the first direction, and wherein a third length of each of the plurality of first separation areas in the first direction is less than the first length.

3. The display apparatus of claim 1, wherein a first interval between some first separation layers disposed adjacent to each other in the first direction among the plurality of first separation layers is substantially equal to a second interval between second separation layers disposed adjacent to each other in the first direction among the plurality of second separation layers, and wherein a third interval between other first separation layers disposed adjacent to each other in the first direction among the plurality of first separation layers is less than the first interval.

4. The display apparatus of claim 1, wherein first pixel areas arranged in the first direction among the plurality of first pixel areas and the plurality of first separation areas are alternately arranged in the first direction, and wherein second pixel areas arranged in the first direction among the plurality of second pixel areas are disposed adjacent to each other, and second pixel areas arranged in the second direction among the plurality of second pixel areas are spaced apart from each other.

5. The display apparatus of claim 1, wherein the first area further comprises a plurality of second separation areas disposed between first pixel areas adjacent to each other in the second direction among the plurality of first pixel areas, the second area further comprises a plurality of third separation areas disposed between second pixel areas disposed adjacent to each other in the second direction among the plurality of second pixel areas, the first insulating layer further has a plurality of third trenches and a plurality of fourth trenches, the plurality of third trenches being arranged in the second direction and corresponding to boundaries between the first pixel areas arranged in the second direction among the plurality of first pixel areas and the plurality of second separation areas, and the plurality of fourth trenches being arranged in the second direction and corresponding to boundaries between the second pixel areas arranged in the second direction among the plurality of second pixel areas and the plurality of third separation areas, and the display apparatus further comprises:

a plurality of third separation layers buried in the plurality of third trenches and including a material that is different from a material of the first insulating layer; and a plurality of fourth separation layers buried in the plurality of fourth trenches and including a material that is different from the material of the first insulating layer.

6. The display apparatus of claim 5, wherein a first length of each of the plurality of first pixel areas in the first direction is substantially equal to a second length of each of the plurality of second pixel areas in the first direction, a third length of each of the plurality of first separation areas in the first direction is less than the first length of each of the plurality of first pixel areas in the first direction, a fourth length of each of the plurality of first pixel areas in the second direction is substantially equal to a fifth length of each of the plurality of second pixel areas in the second direction, a sixth length of each of the plurality of second separation areas in the second direction is less than the fourth length of each of the plurality of first pixel areas in the second direction, and a seventh length of each of the plurality of third separation areas in the second direction is substantially equal to the sixth length of each of the plurality of second separation areas in the second direction.

7. The display apparatus of claim 5, wherein a first interval between some first separation layers disposed adjacent to each other in the first direction among the plurality of first separation layers is substantially equal to a second interval between second separation layers disposed adjacent to each other in the first direction among the plurality of second separation layers, a third interval between other first separation layers disposed adjacent to each other in the first direction among the plurality of first separation layers is less than the first interval, a fourth interval between some third separation layers disposed adjacent to each other in the second direction among the plurality of third separation layers is substantially equal to a fifth interval between some fourth separation layers disposed adjacent to each other in the second direction among the plurality of fourth separation layers, a sixth interval between other third separation layers disposed adjacent to each other in the second direction among the plurality of third separation layers is less than the fourth interval, and a seventh interval between other fourth separation layers disposed adjacent to each other in the second direction among the plurality of fourth separation layers is substantially equal to the sixth interval.

8. The display apparatus of claim 1, wherein a first thickness of each of the plurality of first separation layers in a thickness direction of the substrate is greater than a second thickness of each of the plurality of second separation layers in the thickness direction of the substrate.

9. The display apparatus of claim 1, wherein a plurality of first areas and a plurality of second areas are provided, and wherein the plurality of first areas and the plurality of second areas are alternately arranged in the first direction.

10. The display apparatus of claim 1, further comprising:

a plurality of first pixel circuits disposed on some second pixel areas among the plurality of second pixel areas;

a plurality of second pixel circuits disposed on other second pixel areas among the plurality of second pixel areas;

a plurality of first display elements disposed on the first area and electrically connected to the plurality of first pixel circuits; and a plurality of second display elements disposed on the second area and electrically connected to the plurality of second pixel circuits, wherein a first interval between first display elements disposed adjacent to each other in the first direction among the plurality of first display elements is substantially equal to a second interval between second display elements disposed adjacent to each other in the first direction among the plurality of second display elements.

11. The display apparatus of claim 1, further comprising a plurality of conductive patterns disposed between the substrate and the plurality of first separation layers and in contact with the plurality of first separation layers.

12. The display apparatus of claim 1, further comprising a plurality of semiconductor patterns disposed between the substrate and the plurality of first separation layers and in contact with the plurality of first separation layers.

13. The display apparatus of claim 1, wherein a first thickness of each of the plurality of first separation layers in a thickness direction of the substrate is substantially equal to a second thickness of each of the plurality of second separation layers in the thickness direction of the substrate.

14. The display apparatus of claim 1, further comprising:

a plurality of first pixel circuits disposed on the plurality of first pixel areas;

a plurality of second pixel circuits disposed on the plurality of second pixel areas;

a plurality of first display elements disposed on the first area and electrically connected to the plurality of first pixel circuits; and a plurality of second display elements disposed on the second area and electrically connected to the plurality of second pixel circuits, wherein a first interval between first display elements disposed adjacent to each other in the first direction among the plurality of first display elements is substantially equal to a second interval between second display elements disposed adjacent to each other in the first direction among the plurality of second display elements.

15. The display apparatus of claim 1, wherein the first insulating layer includes an inorganic material, the plurality of first separation layers include an organic material and the plurality of second separation layers include an organic material.

16. The display apparatus of claim 1, further comprising:

a conductive layer disposed on the first insulating layer; and a second insulating layer disposed on the conductive layer and integral with the plurality of first separation layers and the plurality of second separation layers.

17. A display apparatus comprising:

a substrate defining a first area and a second area, the first area comprising a plurality of first pixel areas arranged in a first direction and a second direction and a plurality of first separation areas disposed between first pixel areas of the plurality of first pixel areas disposed adjacent to each other in the first direction, and the second area comprising a plurality of second pixel areas arranged in the first direction and the second direction;

a first insulating layer disposed on the substrate and having a plurality of first trenches and a plurality of second trenches, the plurality of first trenches being arranged in the first direction and corresponding to boundaries between first pixel areas of the plurality of first pixel areas arranged in the first direction and the plurality of first separation areas, the plurality of second trenches being arranged in the first direction and corresponding to boundaries between second pixel areas of the plurality of second pixel areas arranged in the first direction;

a plurality of first separation layers buried in the plurality of first trenches and including a material that is different from a material of the first insulating layer; and a plurality of second separation layers buried in the plurality of second trenches and including a material that is different from the material of the first insulating layer, wherein:

the substrate further defines a folding area including the first area and the second area, and a non-folding area, and the display apparatus further comprises a support layer disposed below the substrate, the support layer comprising a first support portion comprising a slit corresponding to the first area of the folding area and a rib corresponding to the second area of the folding area, and a second support portion corresponding to the non-folding area.

18. The display apparatus of claim 17, wherein the non-folding area comprises a plurality of third pixel areas arranged in the first direction and the second direction and a plurality of second separation areas disposed between third pixel areas adjacent to each other in the first direction among the plurality of third pixel areas, the first insulating layer further has a plurality of third trenches arranged in the first direction and corresponding to boundaries between third pixel areas arranged in the first direction among the plurality of third pixel areas and the plurality of second separation areas, and the display apparatus further comprises a plurality of third separation layers buried in the plurality of third trenches and including a material that is different from a material of the first insulating layer.

19. The display apparatus of claim 18, wherein a first thickness of each of the plurality of first separation layers in a thickness direction of the substrate is greater than a second thickness of each of the plurality of second separation layers in the thickness direction of the substrate and a third thickness of each of the plurality of third separation layers in the thickness direction of the substrate.

20. The display apparatus of claim 18, further comprising:

a plurality of first pixel circuits disposed on some second pixel areas among the plurality of second pixel areas;

a plurality of second pixel circuits disposed on other second pixel areas among the plurality of second pixel areas;

a plurality of third pixel circuits disposed on the plurality of third pixel areas;

a plurality of first display elements disposed on the first area of the folding area and electrically connected to the plurality of first pixel circuits;

a plurality of second display elements disposed on the second area of the folding area and electrically connected to the plurality of second pixel circuits; and a plurality of third display elements disposed on the non-folding area and electrically connected to the plurality of third pixel circuits, wherein a first interval between first display elements disposed adjacent to each other in the first direction among the plurality of first display elements is substantially equal to a second interval between second display elements disposed adjacent to each other in the first direction among the plurality of second display elements and a third interval between third display elements disposed adjacent to each other in the first direction among the plurality of third display elements.

* * * * *